(12) United States Patent
Kotou

(10) Patent No.: US 12,557,285 B2
(45) Date of Patent: Feb. 17, 2026

(54) MEMORY DEVICE

(71) Applicant: Kioxia Corporation, Tokyo (JP)

(72) Inventor: Takahiro Kotou, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 549 days.

(21) Appl. No.: 18/053,890

(22) Filed: Nov. 9, 2022

(65) Prior Publication Data

US 2024/0023335 A1    Jan. 18, 2024

(30) Foreign Application Priority Data

Jul. 15, 2022  (JP) .................................. 2022-114197

(51) Int. Cl.
*H10B 43/27*    (2023.01)
*H10B 43/10*    (2023.01)
*H10B 43/50*    (2023.01)

(52) U.S. Cl.
CPC ............. *H10B 43/27* (2023.02); *H10B 43/10* (2023.02); *H10B 43/50* (2023.02)

(58) Field of Classification Search
CPC ......... H10B 43/10; H10B 43/27; H10B 43/50
See application file for complete search history.

(56) References Cited

U.S. PATENT DOCUMENTS

| | | | |
|---|---|---|---|
| 10,141,326 B1 * | 11/2018 | Oh | ......................... H10B 43/40 |
| 2020/0051989 A1 | 2/2020 | Shimizu et al. | |
| 2020/0251489 A1 | 8/2020 | Tsutsumi et al. | |
| 2020/0365616 A1 * | 11/2020 | Baek | ...................... H10B 43/40 |
| 2021/0193673 A1 | 6/2021 | Lai et al. | |
| 2021/0407905 A1 | 12/2021 | Shimizu et al. | |

OTHER PUBLICATIONS

U.S. Appl. No. 17/692,711, for Satoshi Nagashima, filed Mar. 11, 2022, 173 pages.

* cited by examiner

*Primary Examiner* — Zandra V Smith
*Assistant Examiner* — Molly K Reida
(74) *Attorney, Agent, or Firm* — Maier & Maier, PLLC

(57) ABSTRACT

Each of first conductors arranged in a first direction has a first portion not covered by an adjacent first conductor. A memory pillar extending in the first direction is in contact with the first conductors. A third conductor extending in the first direction has a lower surface in contact with the first portion of one of the first conductors. A fourth conductor penetrates the first portion of a fifth conductor which is one of the first conductors and at least one sixth conductor closer to a side of a second direction than the fifth conductor. The side surface of the fourth conductor is in contact with the fifth conductor. The at least one first insulator covers a surface of each of the at least one sixth conductor.

5 Claims, 36 Drawing Sheets

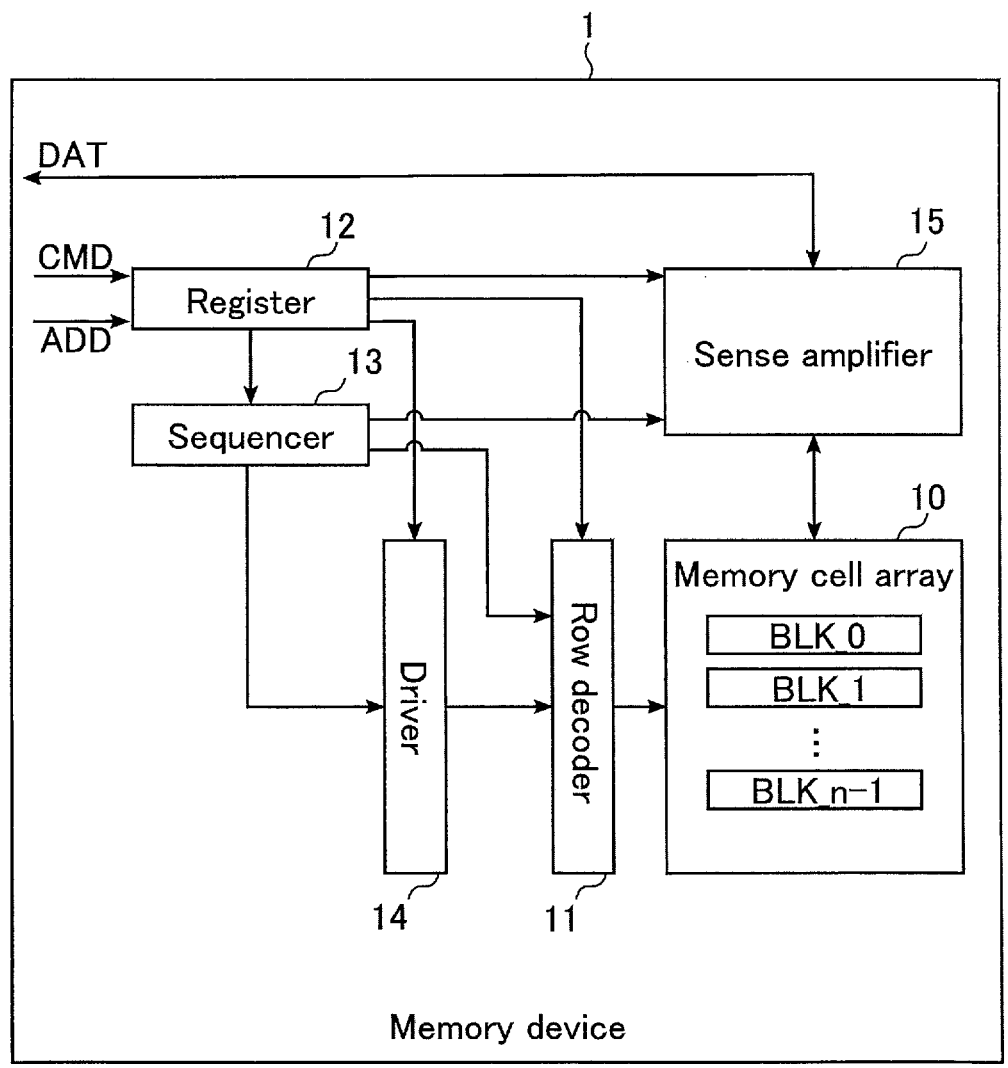
F I G. 1

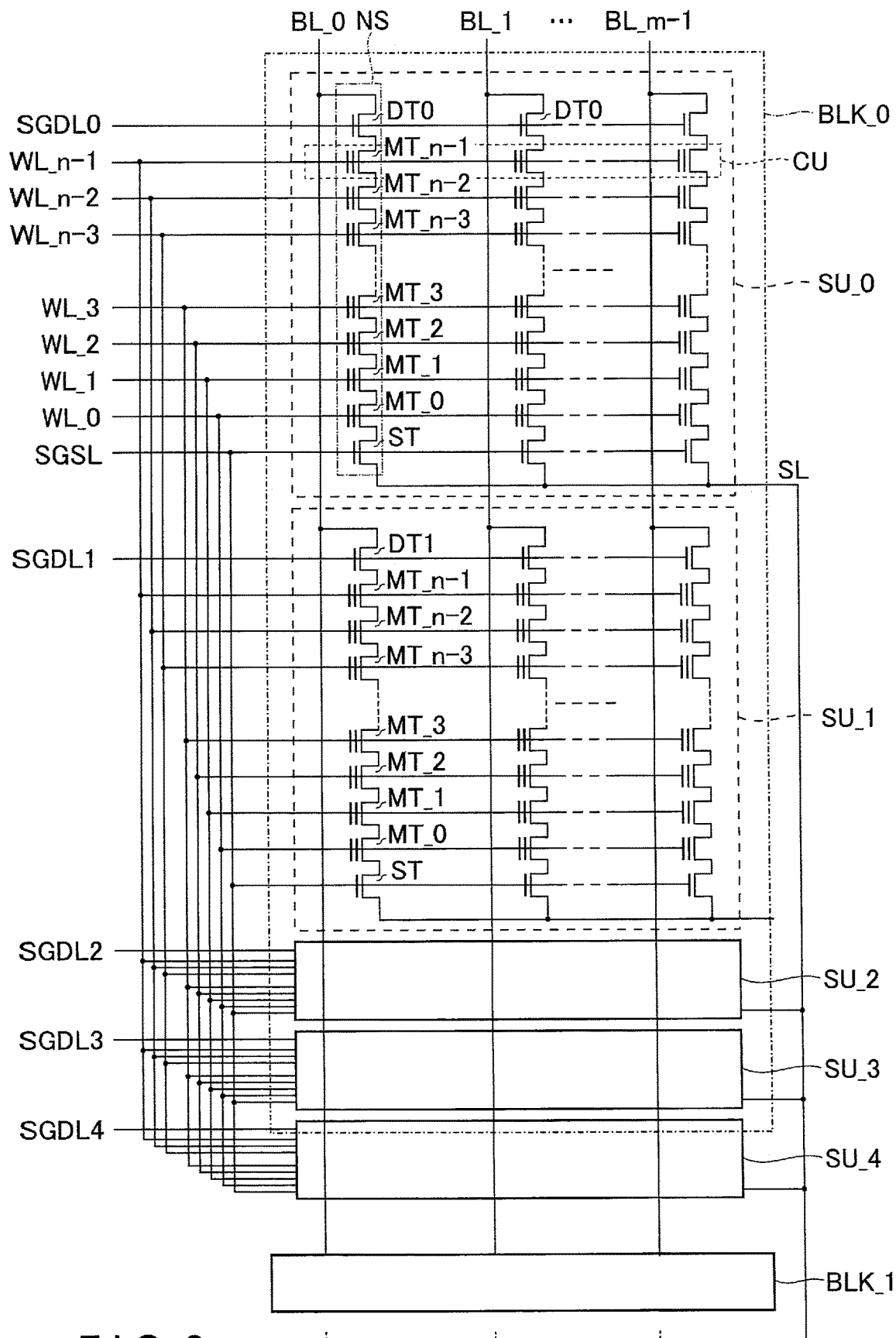
F I G. 2

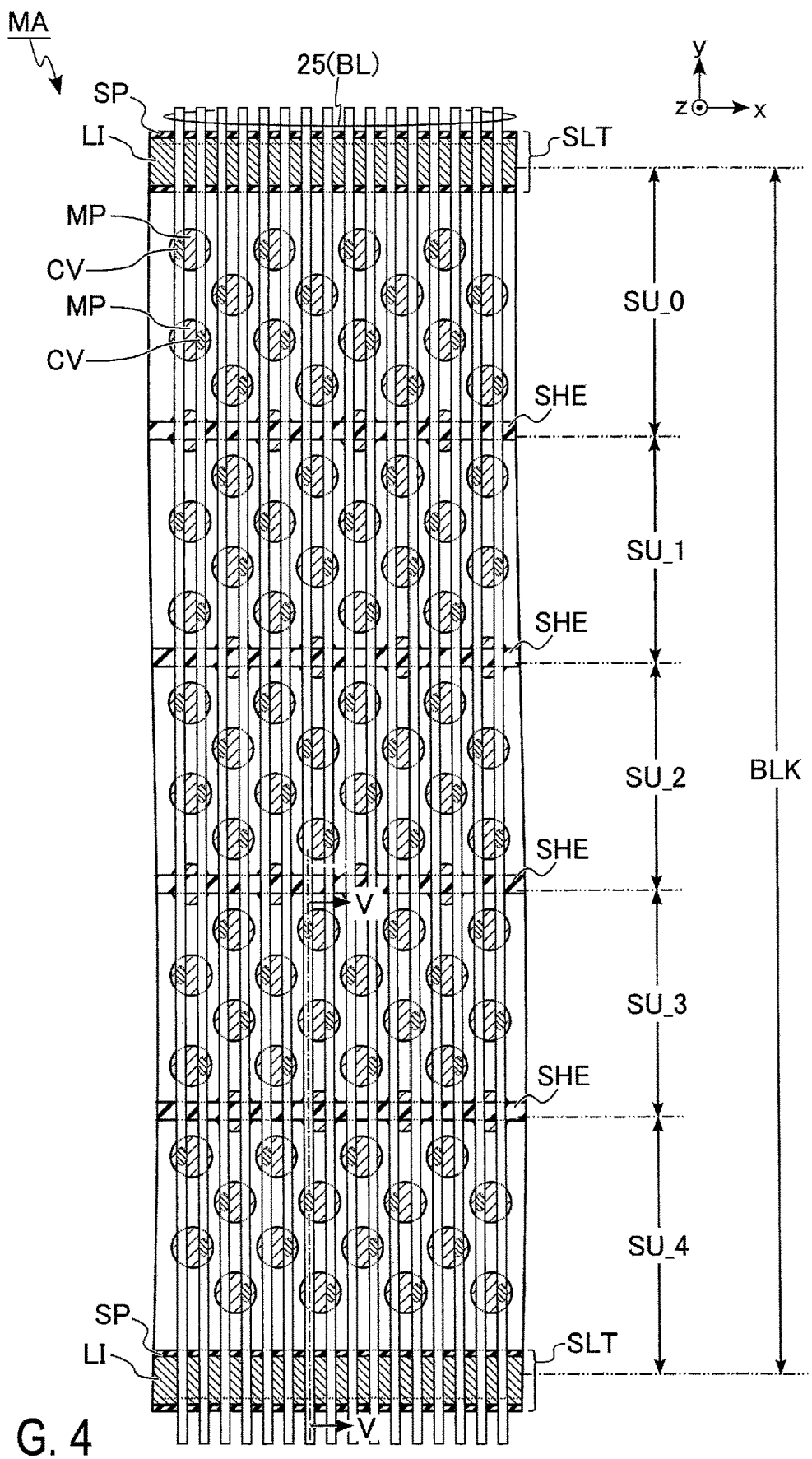
F I G. 4

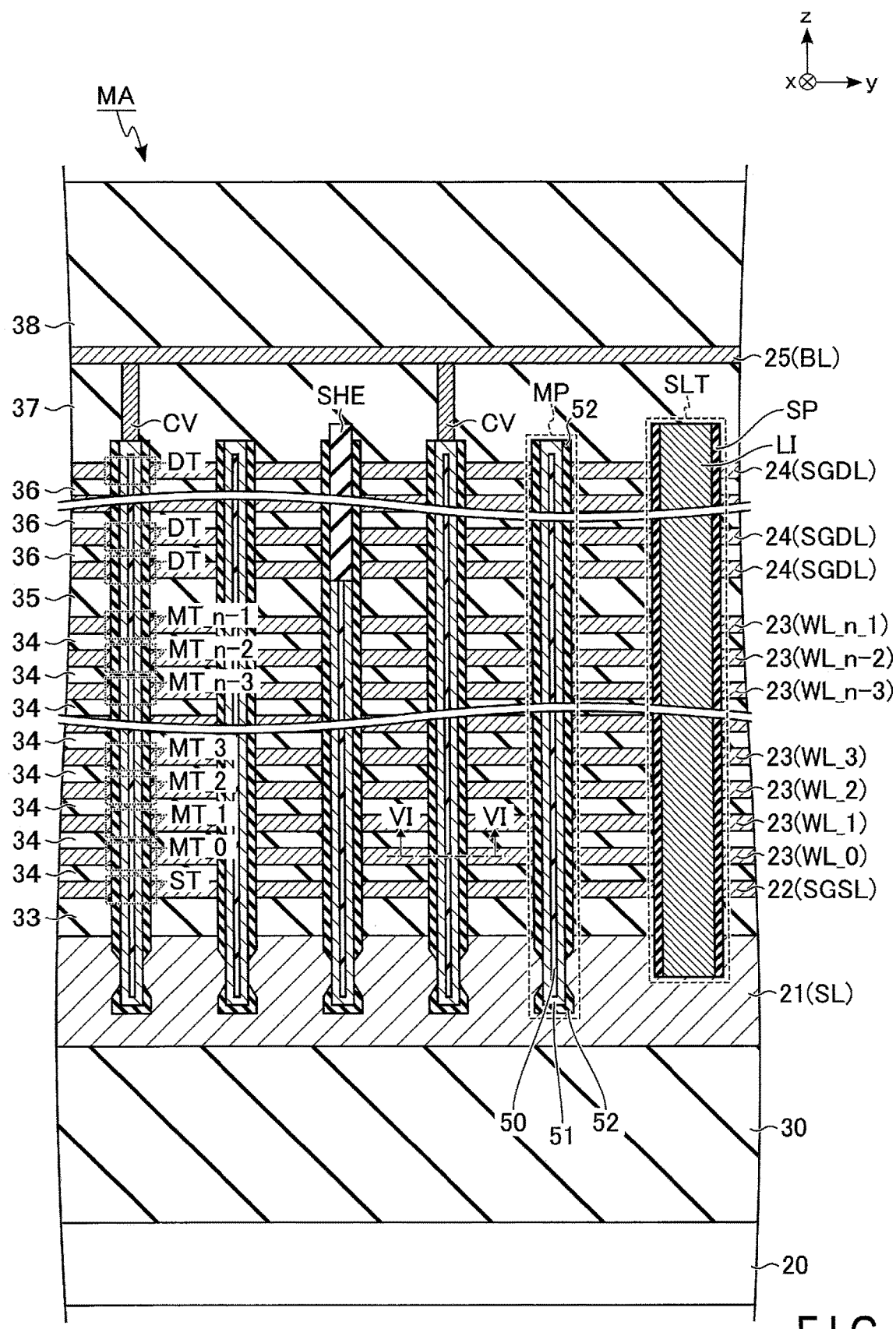
F I G. 5

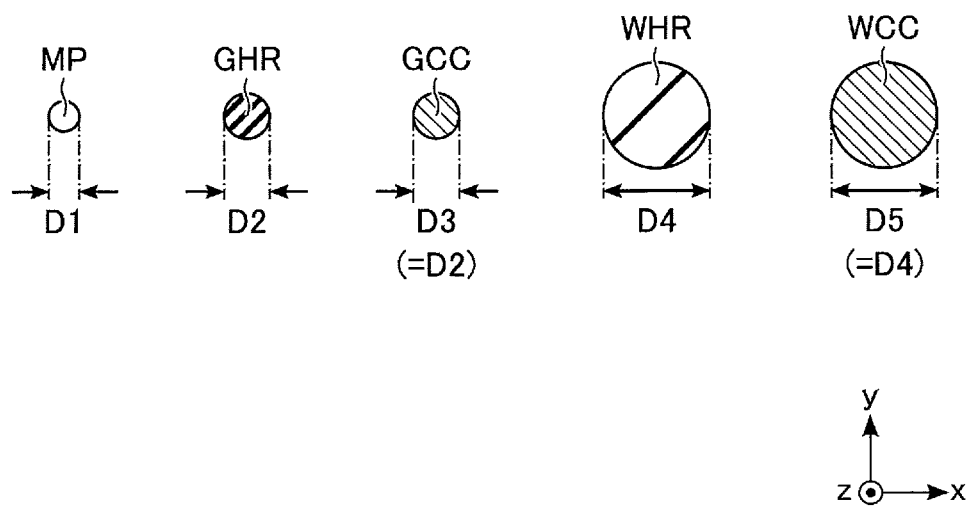
F I G. 8

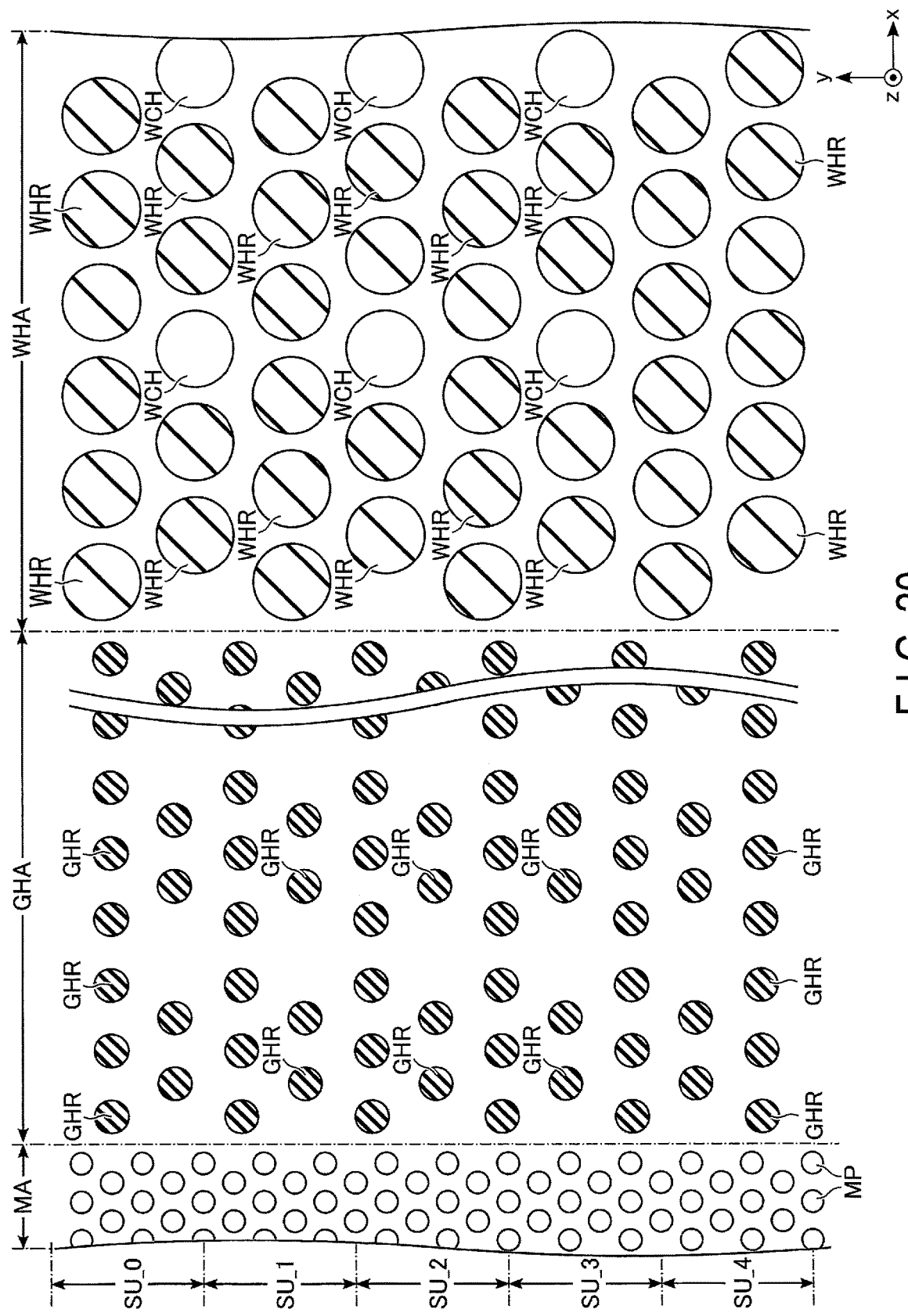
F I G. 20

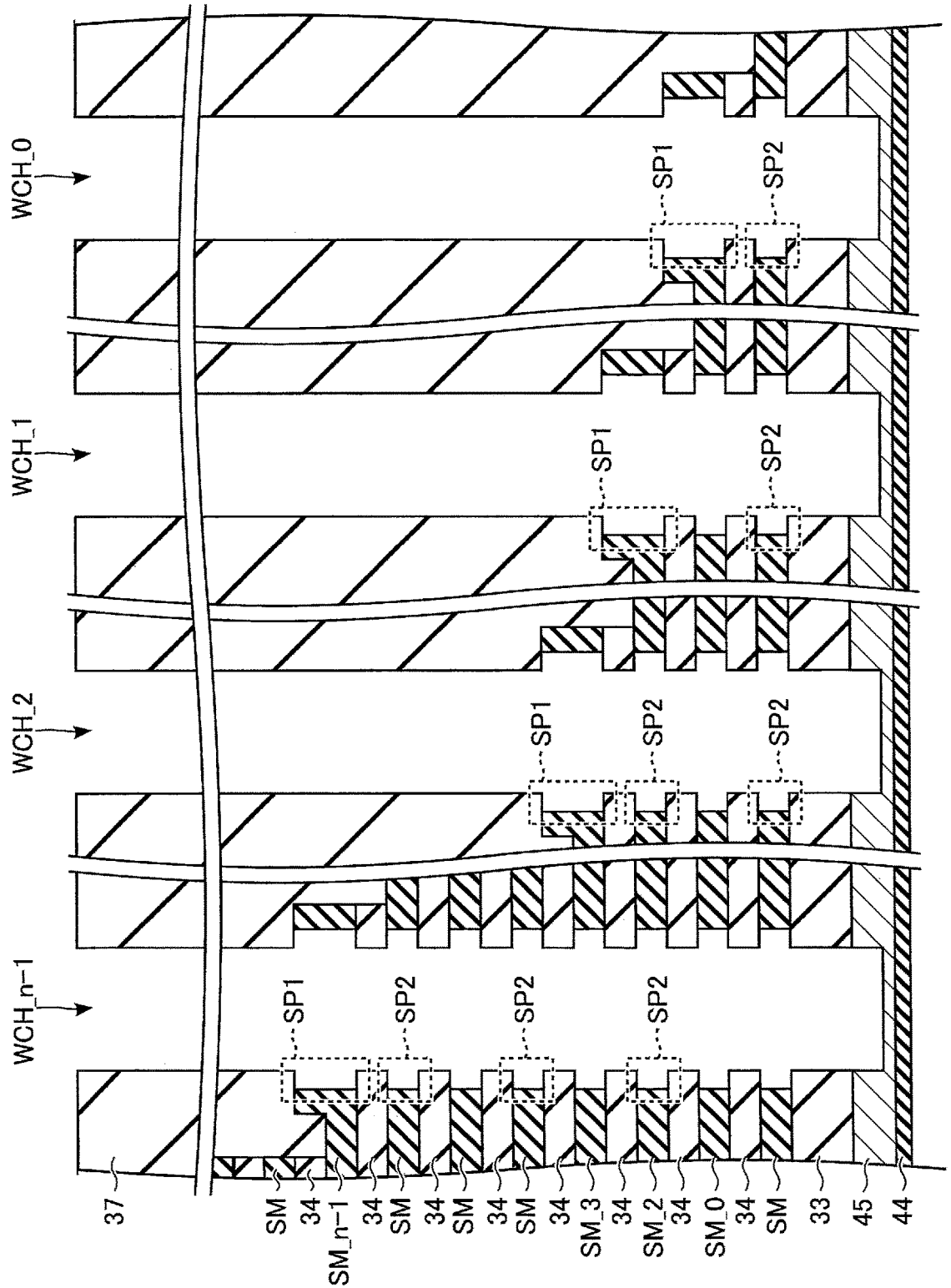
F I G. 22

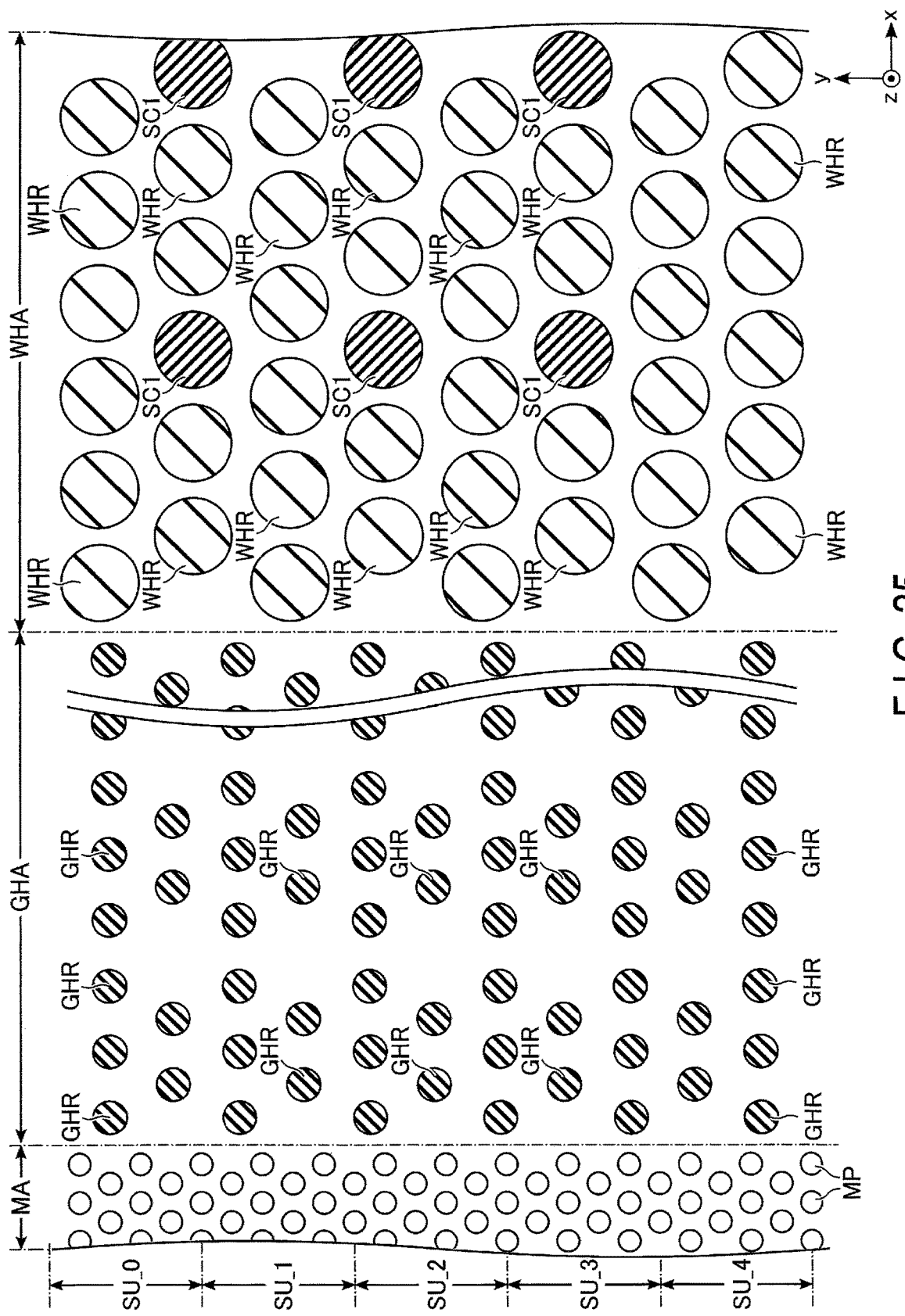
F I G. 25

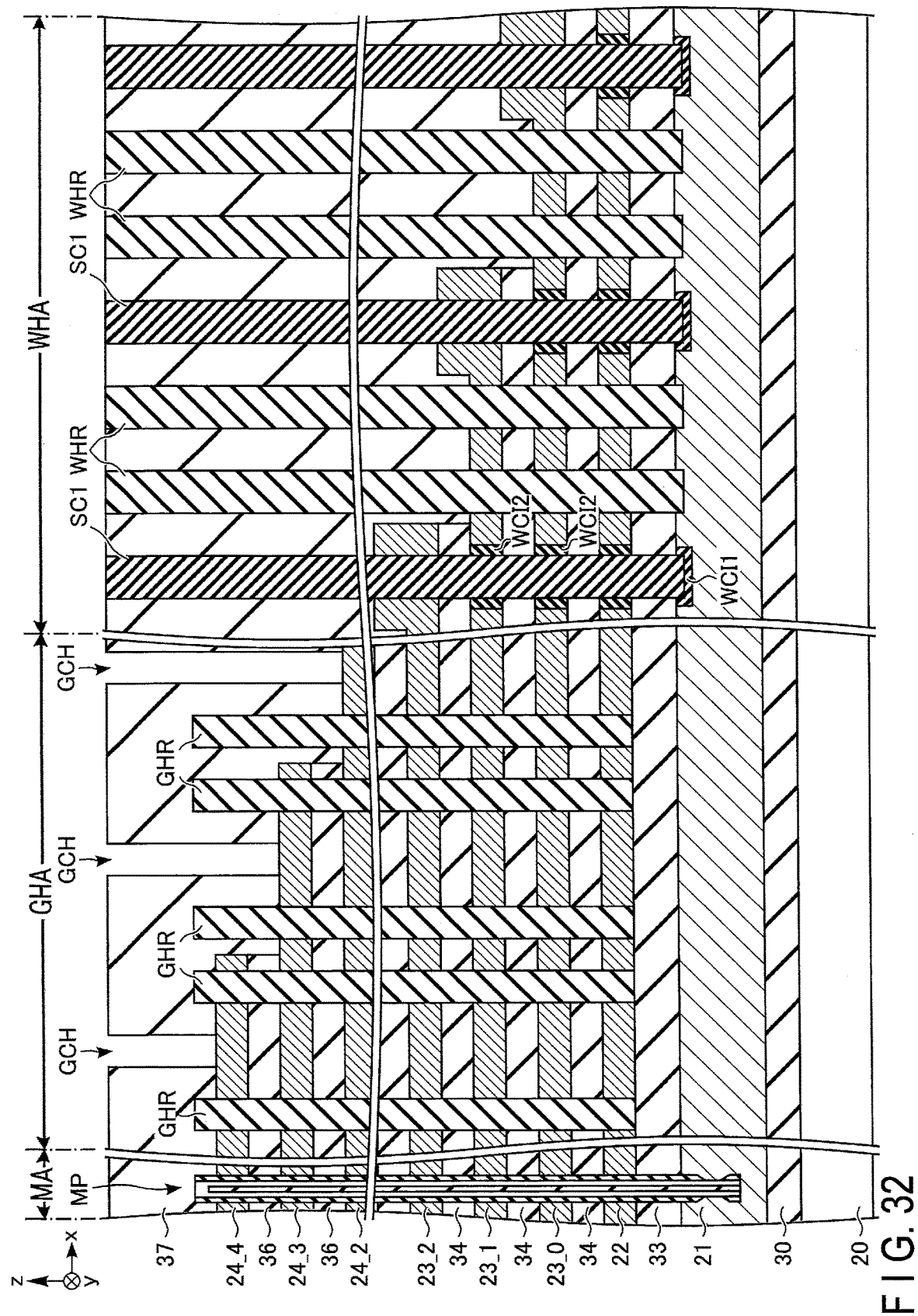
F I G. 32

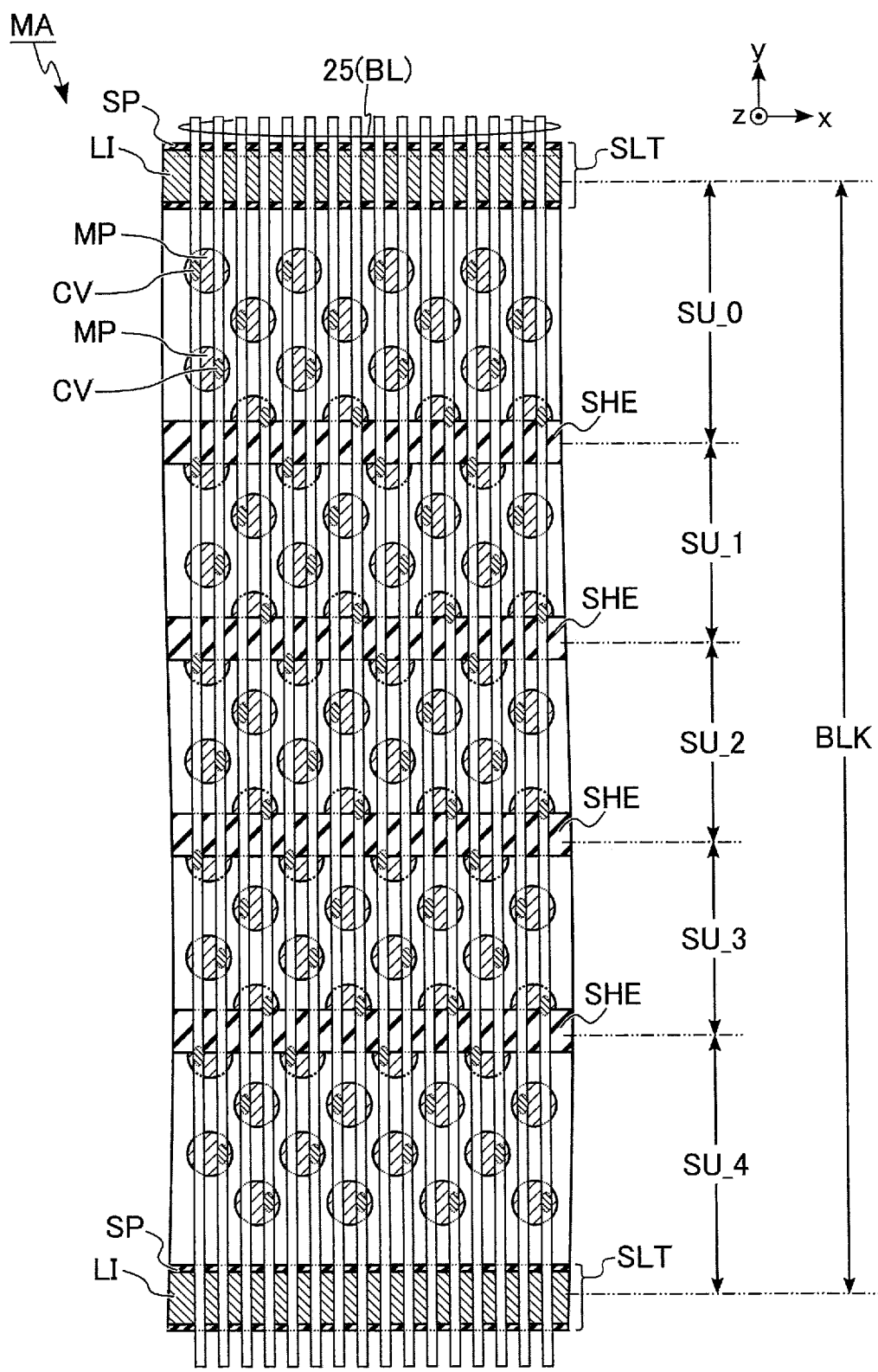
F I G. 36

MEMORY DEVICE

CROSS-REFERENCE TO RELATED APPLICATION(S)

This application is based upon and claims the benefit of priority from Japanese Patent Application No. 2022-114197, filed Jul. 15, 2022, the entire contents of which are incorporated herein by reference.

FIELD

Embodiments described herein relate generally to a memory device.

BACKGROUND

A memory device in which memory cells are arranged three-dimensionally is known. There is a demand for a memory device having a smaller area size.

BRIEF DESCRIPTION OF THE DRAWINGS

FIG. 1 shows components of a memory device according to a first embodiment and an example of how they are coupled.

FIG. 2 shows components of a block of the memory device according to the first embodiment and how they are coupled.

FIG. 4 shows an example of a plane structure of part of a memory cell area according to the first embodiment.

FIG. 5 shows a cross-sectional structure of part of the memory cell area according to the first embodiment.

FIG. 8 shows dimensions of some components of the first embodiment.

FIG. 20 shows a plane structure of part of the memory cell area according to the first embodiment during the manufacturing process.

FIGS. 21, 22, 23, and 24 each shows a cross-sectional structure of part of the memory cell area according to the first embodiment during the manufacturing process.

FIG. 25 shows a plane structure of part of the memory cell area according to the first embodiment during the manufacturing process.

FIG. 32 shows a cross-sectional structure of part of the memory cell area according to the first embodiment during the manufacturing process.

FIG. 36 shows a cross-sectional structure of part of the memory cell area according to a modification of the first embodiment.

DETAILED DESCRIPTION

Figure 3:
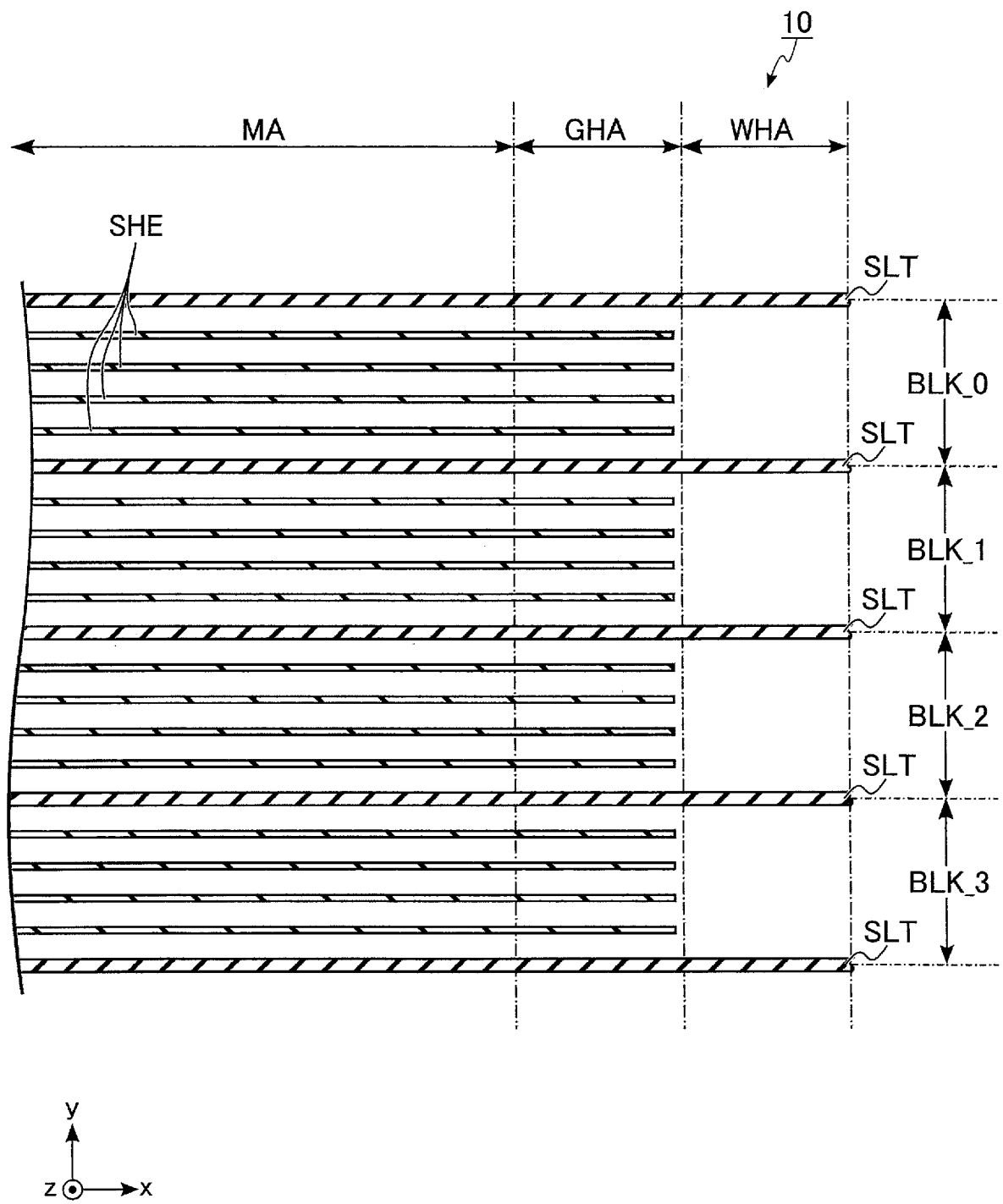
FIG. 3 shows an example of a plane structure of part of a memory cell array according to the first embodiment.

In general, according to one embodiment, a memory device includes a plurality of first conductors; a memory pillar; a third conductor; a fourth conductor; and at least one first insulator.

The first conductors are arranged in a first direction at intervals. Each first conductor has a first portion not covered by an adjacent first conductor on a side of the first direction of the first conductor. The memory pillar extends in the first direction and is in contact with the first conductors. The memory pillar includes a semiconductor and a film that surrounds the semiconductor. The third conductor extends in the first direction and has a lower surface in contact with a surface of the first portion of a second conductor on a side of the first direction. The second conductor is one of the first conductors. The fourth conductor extends in the first direction. The fourth conductor penetrates the first portion of a fifth conductor which is one of the first conductors and at least one sixth conductor located closer to a side of a second direction opposite to the first direction than the fifth conductor. The side surface of the fourth conductor is in contact with the fifth conductor. The at least one first insulator covers a surface of each of the at least one sixth conductor, the surface facing the fourth conductor.

In the following description, in an embodiment following an embodiment that is already described, different points from the already described embodiment are mainly described. The entire description of a particular embodiment also applies to another embodiment unless explicitly mentioned otherwise or obviously eliminated. Thus, a description of a certain embodiment, in principle, does not include the same content as the description of a preceding embodiment, unless where necessary. A plurality of components having substantially the same function and configuration in a certain embodiment or over different embodiments may be denoted by reference signs with suffix numerals or characters for the purpose of distinction.

The figures are schematic, and the relation between the thickness and the area of a plane of a layer and the ratio of thicknesses of layers may differ from those in actuality. The figures may include components which differ in relations and/or ratios of dimensions in different figures. Hatching may be added to plan views to improve visibility. The hatching, however, may not necessarily relate to the materials and/or properties of the hatched structural components.

The specification and the claims, when mentioning that a particular (first) component is "coupled" to another (second) component, intend to cover both the form of the first component directly coupled to the second component and the form of the first component coupled to the second component via one or more components which are always or selectively conductive.

The embodiments will be described using an xyz orthogonal coordinate system.

A plus direction of a vertical axis in a drawing may be referred to as an upper side, and a minus direction of the vertical axis may be referred to as a lower side. A plus direction of a horizontal axis in a drawing may be referred to as a right side, and a minus direction of the horizontal axis may be referred to as a left side.

1. First Embodiment 1.1. Configuration (Structure)

1.1.1 Memory Device

FIG. 1 shows examples of components of a memory device according to a first embodiment and coupling among the components. A memory device 1 is a device that stores data by using a memory cell. The memory device 1 is controlled by an external memory controller. The memory device 1 operates based on, for example, a command CMD and address information ADD received from the memory controller. The memory device 1 receives data DAT to be written, and outputs data stored in the memory device 1. The memory device 1 is configured, for example, as a single semiconductor chip.

As shown in FIG. 1, the memory device 1 includes components such as a memory cell array 10, a row decoder 11, a register 12, a sequencer 13, a driver 14, or a sense amplifier 15.

The memory cell array 10 is a set of memory cell transistors and components that are coupled to the memory cell transistors. The memory cell array 10 includes a plurality of memory blocks (or, blocks) BLK (i.e., BLK_0, BLK_1, . . . ). Each of the blocks BLK includes a plurality of memory cell transistors MT (not shown). In the memory cell array 10, interconnects such as word lines WL (not shown) or bit line BLs (not shown), and interconnects that are coupled to the memory cell transistors MT are also located.

The row decoder 11 is a circuit that selects a block BLK. The row decoder 11 transfers voltages supplied from the driver 14, to a single block BLK selected based on a block address received from the register 12.

The register 12 is a circuit that holds a command CMD and address information ADD received by the memory device 1. The command CMD instructs the sequencer 13 to perform various operations including data read, data write, and data erase. The address information ADD designates a target of access in the memory cell array 10.

The sequencer 13 is a circuit that controls an operation of the entirety of the memory device 1. The sequencer 13 controls the row decoder 11, the driver 14, and the sense amplifier 15 based on the command CMD received from the register 12 to perform various operations including data read, data write, and data erase.

The driver 14 is a circuit that generates a plurality of voltages of different magnitudes, and applies the generated voltages to some components. The driver 14 supplies, from among the generated voltages, voltages selected based on control performed by the sequencer 13 and the address information ADD to the row decoder 11.

The sense amplifier 15 is a circuit that outputs a signal based on data stored in the memory cell array 10. The sense amplifier 15 senses a state of the memory cell transistor MT, generates read data based on the sensed state, or transfers write data to the memory cell transistor MT.

1.1.2. Circuit Configuration of Memory Cell Array

FIG. 2 shows components of a single block BLK of the memory device according to the first embodiment, and coupling among the components. A plurality of blocks BLK, for example, all of the blocks BLK, includes the components and coupling that are shown in FIG. 2.

A single block BLK includes a plurality of string units SU. FIG. 2 shows an example of five string units SU_0 to SU_4.

As shown in FIG. 2, each of m bit lines BL_0 to BL_m−1 is coupled to a single NAND string NS from each of the string units SU_0 to SU_4 in each of the blocks BLK, where m is a positive integer.

Each of the NAND strings NS includes a single select gate transistor ST, n memory cell transistors MT, and a single select gate transistor DT (i.e., DT0, DT1, DT2, DT3, or DT4), where n is a positive integer. The memory cell transistor MT is an element that includes a control gate electrode and a charge storage film insulated from the periphery, and stores data based on a charge amount in the charge storage film in a non-volatile manner. The select gate transistor ST, the memory cell transistors MT, and the select gate transistor DT are coupled in series in this order between a source line SL and a single bit line BL.

A plurality of NAND strings NS respectively coupled to a plurality of different bit lines BL configure a single string unit SU. In each of the string units SU, the control gate electrodes of the memory cell transistors MT_0 to MT_n−1 are respectively coupled to word lines WL_0 to WL_n−1. A group of memory cell transistors MT that share a word line WL in a single string unit SU is referred to as a cell unit CU.

The select gate transistors DT0 to DT4 respectively belong to the string units SU_0 to SU_4. In FIG. 2, the select gate transistors DT2, DT3, and DT4 are not shown. A gate of the select gate transistor DT0 of each of the plurality of NAND strings NS of the string unit SU_0 is coupled to a select gate line SGDL0. Similarly, gates of the select gate transistor DT1, DT2, DT3, or DT4 of each of the plurality of NAND strings NS of each of the string units SU_1, SU_2, SU_3, and SU_4 are coupled to select gate lines SGDL1, SGDL2, SGDL3, or SGDL4, respectively.

A gate of the select gate transistor ST is coupled to a select gate line SGSL.

1.1.3 Plane Structure of Memory Cell Array

FIG. 3 shows an example of a plane structure of part of a memory cell array of a memory device according to the first embodiment, along the xy-plane. FIG. 3 shows the area in which four blocks BLK_0 to BLK_3 are formed, along the xy-plane. The structure shown in FIG. 3 is repeatedly arranged along the y-axis.

As shown in FIG. 3, the memory cell array 10 includes a memory cell area MA, an SGDL hookup (or, coupling) area GHA, and a WL hookup area WHA. The memory cell area MA, the SGDL hookup area GHA, and the WL hookup area WHA are arranged in this order, along the x-axis. A plurality of members SLT are provided in the memory cell array 10.

The memory cell area MA is an area that includes NAND strings NS. The WL hookup area WHA and the SGDL hookup area GHA are areas with contacts coupled to a layer stack that includes a structure functioning as part of memory cell transistors MT. In the SGDL hookup area GHA, contacts are in contact with a conductor functioning as part of select gate lines SGDL. In the WL hookup area WHA, contacts are in contact with a conductor functioning as part of word lines WL.

The plurality of members SLT extend along the x-axis and are arranged along the y-axis. Each member SLT is located at a boundary between neighboring blocks BLK. The members SLT traverse the memory cell area MA, the SGDL hookup area GHA, and the WL hookup area WHA. Each member SLT has, for example, a structure in which an insulator and/or plate-shaped contacts are buried. Each member SLT divides layer stacks that are adjacent to each other with the member SLT interposed therebetween.

The members SHE extend along the x-axis and are arranged along the y-axis. The members SHE are arranged between every two neighboring members SLT. FIG. 3 shows an example of four members SHE. Each member SHE traverses the memory cell area MA along the x-axis. Each member SHE extends within the SGDL hookup area GHA, along the x-axis. The member SHE includes an insulator, for example. Each member SHE divides select gate lines SGDL that are adjacent to each other with the member SHE interposed therebetween. Each area divided by the members SLT and SHE is an area in which a single string unit SU is formed.

1.1.4. Plane Layout of Memory Area

FIG. 4 shows an example of a plane structure of part of a memory cell area of the memory device according to the first embodiment, and shows a structure along an xy-plane. FIG. 4 shows a single block BLK, that is, an area including the string units SU_0 to SU_4, and two members SLT that sandwich this block BLK. As shown in FIG. 4, the memory cell array 10 includes a plurality of memory pillars MP, a plurality of contact plugs CV, and a plurality of conductors 25 in the memory cell area MA. Each of the members SLT includes a contact LI and a spacer SP.

Of the memory cell area MA, the area in which the string unit SU_0 is formed is an area between a member SLT (not shown) on the upper side and part of the member SHE next to the member SLT. Each area in which the string unit SU_1, SU_2, or SU_3 is formed is an area sandwiched by part of two members SHE that are adjacent to each other. Of the memory cell area MA, the area in which the string unit SU_4 is formed is an area between a member SLT on the lower side and part of the member SHE next to the member SLT. Hereinafter, the area in which a string units SU is formed in the memory cell area MA may be referred to as a "string unit area".

The memory pillar MP is a structure in which the memory cell transistors MT are formed. The memory pillar MP includes one or more of a semiconductor, a conductor, and an insulator. The memory pillar MP functions as a single NAND string NS. A plurality of memory pillars MP are distributed in a staggered array in an area between two members SLT. In other words, the memory pillars MP are arranged in a plurality of columns along the y-axis, and the columns of the memory pillars MP include memory pillars MP arranged in a zig-zag manner along the y-axis. The details of the arrangement are as follows. Each column consists of two sub columns located at different coordinates on the x-axis. Hereinafter, a coordinate on the x-axis may be referred to as an x-axis coordinate, and a coordinate on the y-axis may be referred to as a y-axis coordinate. A y-axis coordinate of each memory pillar MP of one sub column is located between y-axis coordinates of two adjacent memory pillars MP in another sub column. Each column includes 24 memory pillars MP, for example.

The members SHE respectively overlap, for example, 5th, 10th, 15th, and 20th memory pillars MP counted from an upper side of the FIG. 4.

Each of the conductors 25 functions as a single bit line BL. The conductors 25 extend along the y-axis, and are arranged along the x-axis. Each of the conductors 25 is disposed to overlap at least a single memory pillar MP in each of the string units SU. FIG. 4 shows an example where two conductors 25 are disposed to overlap a single memory pillar MP. Each of the memory pillars MP is electrically coupled to a single conductor 25 of a plurality of conductors 25 that overlaps this memory pillar MP by using the contact plug CV.

The contact LI includes a conductor. The contact LI extends along an xz-plane, and has a plate shape. The spacer SP is an insulator, is located on a side surface of the contact LI, and covers, for example, the side surface of the contact LI.

1.1.5. Cross-Sectional Structure of Memory Cell Area

FIG. 5 shows a structure of a cross section of part of the memory cell area of the memory device according to the first embodiment, and shows a structure along a yz-Plane. Specifically, FIG. 5 shows a cross section along line V-V of FIG. 4.

As shown in FIG. 5, the memory cell array 10 further includes a substrate 20, conductors 21 and 22, n conductors 23, conductors 24, a conductor 25, and insulators 30 to 38. The insulators 30, and 33 to 38 include or are made of, for example, silicon oxide.

The substrate 20 is, for example, a substrate of a p-type semiconductor. On an upper surface of the substrate 20, the insulator 30 is located.

The conductor 21 is located on an upper surface of the insulator 30. The conductor 21 extends along the xy-plane, and has a plate shape. The conductor 21 functions as at least part of the source line SL. The conductor 21 includes or is made of, for example, silicon doped with phosphorus.

The insulator 33 is located on an upper surface of the conductor 21.

The conductor 22 is located on an upper surface of the insulator 33. The conductor 22 extends along the xy-plane, and has a plate shape. The conductor 22 functions as at least part of the select gate line SGSL. The conductor 22 includes or is made of, for example, tungsten.

The insulators 34 and the conductors 23 are located alternately one by one along a z-axis on an upper surface of the conductor 22. Accordingly, the conductors 23 are arranged along the z-axis to be separated or spaced from each other. The insulators 34 and the conductors 23 extend along the xy-plane, and have a plate shape. The conductors 23 respectively function as at least part of the word lines WL_0 to WL_n−1 in order from a side of the substrate 20. The conductors 23 include or are made of, for example, tungsten.

The insulator 35 is located on an upper surface of an uppermost conductor 23.

The conductors 24 and the insulators 36 are located alternately one by one along the z-axis on an upper surface of the insulator 35. Accordingly, the conductors 24 are arranged along the z-axis to be separated or spaced from each other. The conductors 24 and insulators 36 extend along the xy-plane, and has a plate shape. A set of the conductors 24 functions as at least part of one of the select gate lines SGDL0 to SGDL4. The conductors 24 include or are made of, for example, tungsten.

The insulator 37 is located on an upper surface of the uppermost conductor 24.

The conductor 25 is located on an upper surface of the insulator 37. The conductor 25 has a linear shape, and extends along the y-axis. The conductor 25 functions as at least part of a single bit line BL. The conductor 25 is also provided on a yz-plane that is different from the yz-plane shown in FIG. 5, and therefore the conductors 25 are arranged along the x-axis to be spaced apart from each other. The conductor 25 includes or is made of, for example, copper.

The insulator 38 is located on an upper surface of the conductor 25.

The memory pillars MP extend along the z-axis, and has a pillar shape. The memory pillars MP are located in a layer stack including the insulators 33 to 36 and the conductors 22 to 24, and penetrate or pass through the insulators 33 to 36 and the conductors 22 to 24. Upper faces of the memory pillars MP are located above the uppermost conductor 24. Lower faces of each memory pillars MP are located in the conductor 21. A portion where each memory pillar MP and the conductor 22 are in contact with each other functions as the select gate transistor ST. A portion where each memory pillar MP and a single conductor 23 are in contact with each other functions as a single memory cell transistor MT. A portion where each memory pillar MP and a single conductor 24 are in contact with each other functions as a single select gate transistor DT.

Each memory pillar MP includes, for example, a core 50, a semiconductor 51, and a layer stack 52. The core 50 includes an insulator, and includes or is made of, for example, silicon oxide. The core 50 extends along the z-axis, and has a pillar shape. The semiconductor 51 includes or is made of, for example, silicon. The semiconductor 51 covers a surface of the core 50. The layer stack 52 covers a side surface and a lower surface of the semiconductor 51. The layer stack 52 is opened in the conductor 21, and the conductor 21 is partially located in an opening. In the opening, the conductor 21 is in contact with the semiconductor 51.

As described above, a single memory pillar MP and a single conductor 25 are coupled by the contact plug CV.

The member SLT divides the conductors 22 to 24. An upper surface of the member SLT is located above the upper faces of the memory pillars MP. A lower surface of the contact LI is in contact with the conductor 21. The spacer SP is located between the contact LI and the conductors 22 to 24, and insulates the contact LI from the conductors 22 to 24. The contact LI functions as part of the source line SL.

The member SHE divides the conductor 24. A lower surface of the member SHE is located in the insulator 35. The member SHE includes an insulator, and includes or is made of, for example, silicon oxide.

Figure 6:
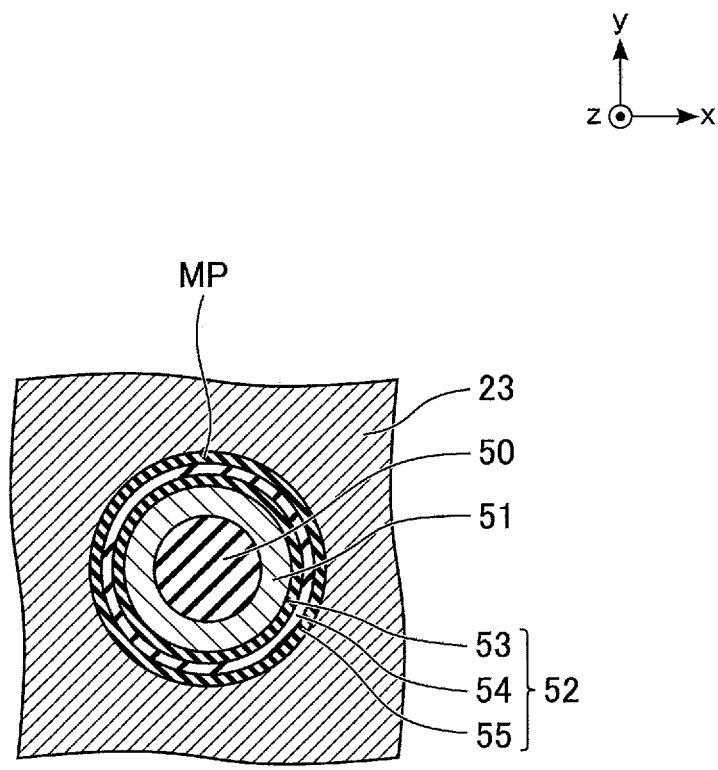
FIG. 6 shows a cross-sectional structure of a memory pillar according to the first embodiment.

FIG. 6 shows an example of a structure of a cross section of a memory pillar of the memory device according to the first embodiment. Specifically, FIG. 6 shows a cross section along line VI-VI of FIG. 5. As shown in FIG. 6, the layer stack 52 includes, for example, a tunnel insulator 53, a charge storage film 54, and a block insulator 55.

The tunnel insulator 53 surrounds the side surface of the semiconductor 51. The charge storage film 54 surrounds a side surface of the tunnel insulator 53. The block insulator 55 surrounds a side surface of the charge storage film 54. The conductor 23 surrounds a side surface of the block insulator 55.

The semiconductor 51 functions as a channel (or, a current path) of the memory cell transistors MT and the select gate transistors DT and ST. Each of the tunnel insulator 53 and the block insulator 55 includes, for example, silicon oxide. The charge storage film 54 stores charges. The charge storage film 54 includes, for example, silicon nitride.

Figure 7:
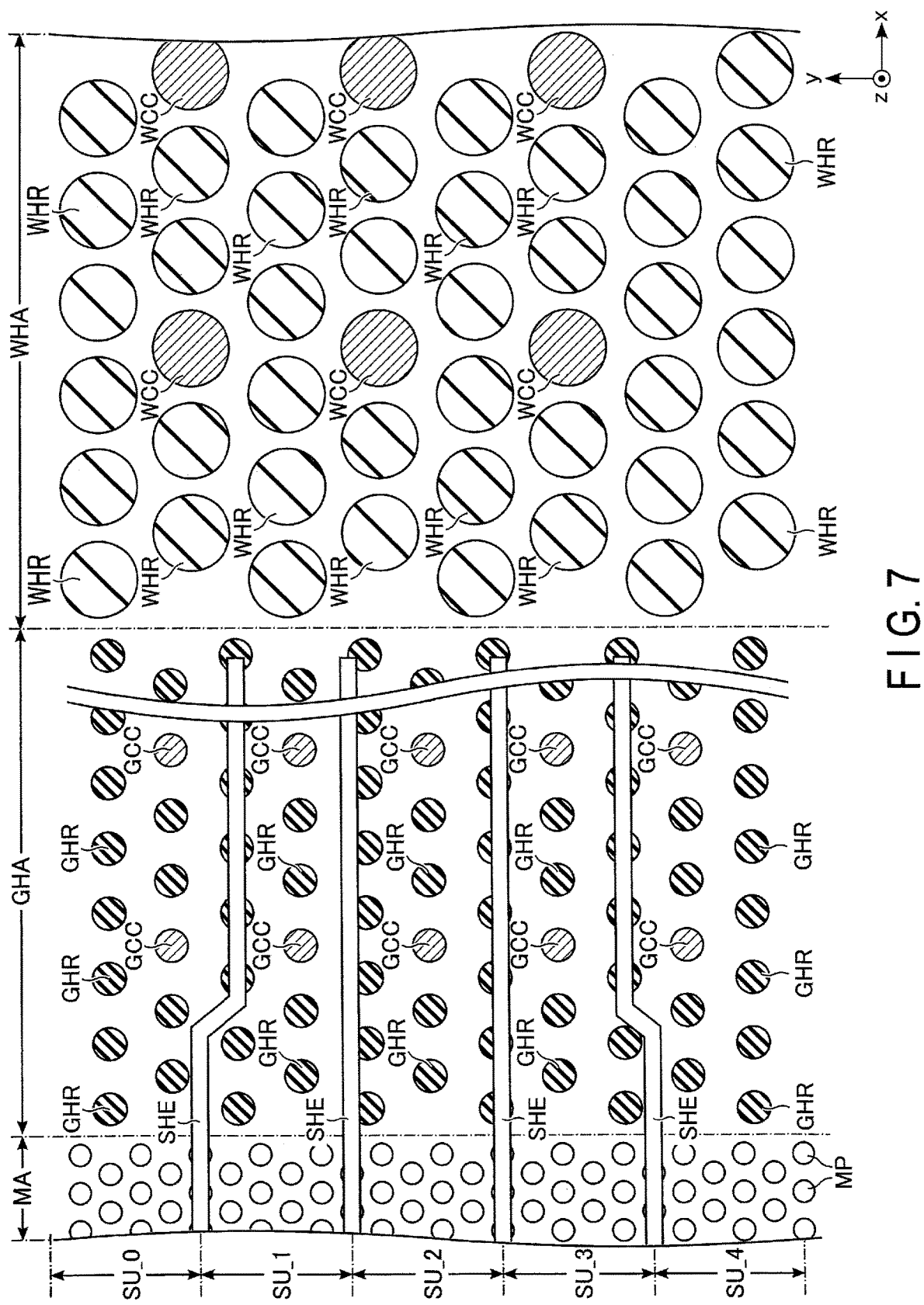
FIG. 7 shows an example of a plane structure of part of a memory cell array according to the first embodiment.

1.1.6. Structures of SGDL Hookup Area and WL Hookup Area 1.1.6.1 Plan Layouts of SGDL Hookup Area and WL Hookup Area FIG. 7 shows an example of a plane structure of part of a memory cell array of a memory device according to the first embodiment, along the xy-plane. Specifically, FIG. 7 shows a structure of part of the memory cell area MA, the SGDL hookup area GHA, and the WL hookup area WHA, along the xy-plane. FIG. 7 shows the structure viewed from the positive direction of the z-axis. FIG. 7 shows, similarly to FIG. 4, an area between two members SLT (not shown) with respect to the y-axis, in other words, the area in which the string units SU_0 to SU_4 are formed in the memory cell area MA. The members SLT (not shown) are located at the upper side of the upper end and the lower side of the lower end of the area shown in FIG. 7.

As described in the above with reference to FIG. 4, the memory cell area MA includes a plurality of memory pillars MP, which are arranged in a staggered arrangement. FIG. 7 shows the shape of the upper faces of the memory pillars MP.

The SGDL hookup area GHA includes a plurality of contacts GCC and a plurality of support pillars GHR. Each contact GCC and each support pillar GHR have a shape of a pillar extending along the z-axis, for example, a cylindrical shape. FIG. 7 shows the shapes of the upper surfaces of the contacts GCC and the support pillars GHR.

Each contact GCC and each support pillar GHR have a diameter larger than that of the upper surface of the memory pillar MP. The diameter of the upper surface of a certain component is a dimension of a component on a virtual straight line passing through the center of the upper surface of this component, for example. Hereinafter, the diameter of the upper surface of each component, such as a memory pillar MP, a contact GCC, or a support pillar GHR, may be simply referred to as a "diameter".

Each contact GCC includes or is made of a conductor. The support pillar GHR includes or is made of an insulator.

The plurality of contacts GCC form a plurality of rows along the x-axis. Each row of the contacts GCC is located with respect to a y-axis, between the y-axis coordinate of the upper end of a single string unit area (or, an area in which the string units SU are formed within the memory cell MA) and a y-axis coordinate of the lower end. For this reason, a single row of the contacts GCC is located within an area extended from each string unit area along the x-axis. Some contacts GCC are aligned along and parallel to, for example, the y-axis, constituting a column. Each contact GCC in a column is located within an area extended from a single string unit area along the x-axis. To realize such an arrangement, it is possible to arrange the contacts GCC in rows and columns, for example.

A plurality of support pillars GHR are distributed within an area in which the contacts GCC are not provided in the SGDL hookup area GHA. For example, a set of the contacts GCC and the support pillars GHR is arranged in a staggered arrangement. In other words, the contacts GCC and the support pillars GHR are arranged in columns along the y-axis, and columns of the contacts GCC and columns of the support pillars GHR are arranged in a zig-zag manner along the y-axis. In other words, each row consists of two sub-rows, and the y-axis coordinate of each contact GCC and each support pillar GHR in one sub-row is located between two adjacent y-axis coordinates of contacts GCC and support pillars GHR in the other sub-row.

A set of contacts GCC and support pillars GHR is arranged in columns along the x-axis.

As described above, each contact GCC and each support pillar GHR have a diameter differing from that of the upper surface of the memory pillar MP. Based at least partially on this circumstance, a period of distribution of a set of contacts GCC and support pillars GHR on the y-axis differs from a period of distribution of the memory pillars MP on the y-axis. For this reason, some members SHE extend along the x-axis as a whole and have a bended portion within the SGDL hookup area GHA. In other words, if a certain member SHE extends parallel to the x-axis from the part within the memory cell MA, the member SHE overlaps the contacts GCC. Such a member SHE is bended toward a part located at a y-axis coordinate differing from that in the memory cell area MA so as to go around the contacts GCC located in the vicinity of the extended line of the x-axis from a part within the memory cell area MA. In the example of FIG. 7, the member SHE dividing the area of string unit SU_0 from that of string unit SU_1 extends downward diagonally and then along the x-axis in the SGDL hookup area GHA. The member SHE that divides the area of string unit SU_3 from that of string unit SU_4 extends upward diagonally and then along the x-axis in the SGDL hookup area GHA.

Since some of the members SHE have such a shape, a single row of contacts GCC is located within each SGDL hookup area GHA, as described above.

The WL hookup area WHA includes a plurality of contacts WCC and a plurality of support pillars WHR. Each contact WCC and each support pillar WHR have a shape of a pillar extending along the z-axis, for example, a cylindrical shape. FIG. 7 shows the shapes of the upper surfaces of the contacts WCC and the support pillars WHR.

Each contact WCC and each support pillar WHR have a diameter larger than that of the upper surface of the contact GCC and the memory pillar GHR respectively.

Each contact WCC includes or is made of a conductor. The support pillar WHR includes or is made of an insulator.

The plurality of contacts WCC form a plurality of rows along the x-axis. Some contacts WCC are aligned along and parallel to, for example, the y-axis. The contacts WCC are arranged in, for example, columns and rows.

A plurality of support pillars WHR are distributed within an area in which the contacts WCC are not provided in the WL hookup area WHA. For example, a set of the contacts WCC and the support pillars WHR is arranged in a staggered arrangement. In other words, the contacts WCC and the support pillars WHR are arranged in columns along the y-axis, and columns of the contacts WCC and columns of the support pillars WHR are arranged in a zig-zag manner along the y-axis. In other words, each row consists of two sub-rows, and the y-axis coordinate of each contact WCC and each support pillar WHR in one sub-row is located between two adjacent y-axis coordinates of contacts WCC and support pillars WHR in the other sub row.

A set of contacts WCC and support pillars WHR is arranged in columns along the x-axis.

FIG. 8 shows dimensions of some components of the first embodiment. Specifically, FIG. 8 shows the upper faces of the memory pillars MP, the contacts GCC, the support pillars GHR, the contacts WCC, and the support pillars WHR. As shown in FIG. 8, each memory pillar MP has a diameter D1.

Each support pillar GHR has a diameter D2. Each contact GCC has a diameter D3. The diameters D2 and D3 are larger than a diameter D1. The diameter D2 may be the same as or different from the diameter D3. For example, the diameter D2 is the same as the diameter D3.

Each support pillar WHR has a diameter D4. Each contact WCC has a diameter D5. The diameters D4 and D5 are larger than a diameter D1. Furthermore, the diameters D4 and D5 may be larger than the diameters D3 and D4, respectively. The diameter D4 may be the same as or different from the diameter D5. For example, the diameter D4 is the same as the diameter D5.

1.1.6.2. Cross-Section Structure of WL Hookup Area

Figure 9:
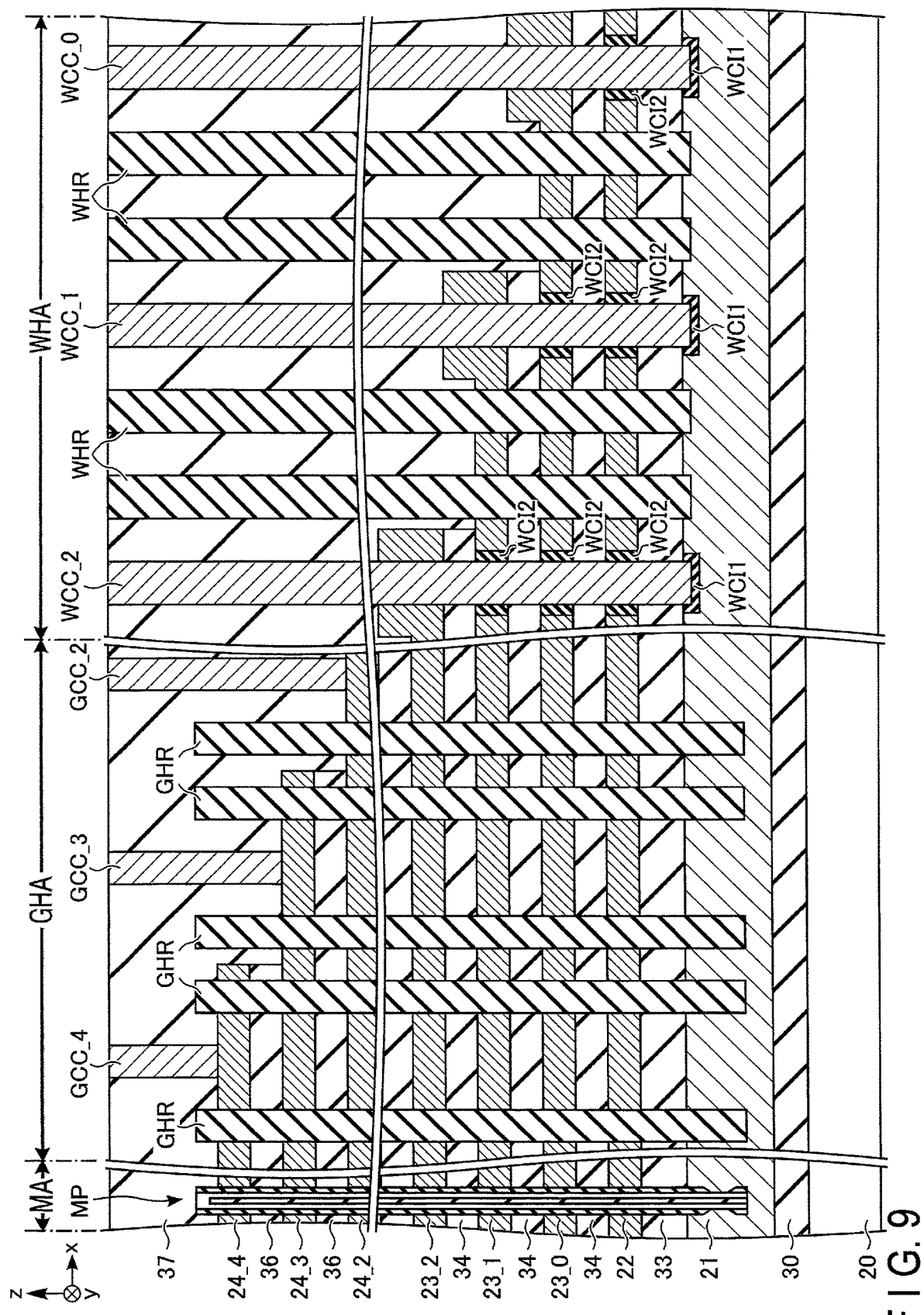
FIG. 9 schematically shows a cross-sectional structure of part of the memory cell area according to the first embodiment.

FIG. 9 schematically shows a cross-sectional structure of part of the memory cell area of the memory device according to the first embodiment. Specifically, FIG. 9 shows a structure of part of the memory cell area MA, the SGDL hookup area GHA, and the WL hookup area WHA, along the xz-plane. Hereinafter, a plurality of conductors 24 may be referred to as conductors 24_0, 24_1, 24_2, 24_3, and 24_4 in this order upward on the z-axis (or, in a plus z direction). Hereinafter, a plurality of conductors 23 may be referred to as conductors 23_0, 23_1, 23_2, ..., 23_n−3, 23_n−2, and 23_1, in this order upward on the z-axis (or, in a plus z direction).

As shown in FIG. 9, the lengths of the conductors 23 and 24 located in different layers along the x-axis vary. Thus, a set of the conductors 23 and 24 and the insulators 34 constitutes a shape of steps. For this reason, each of the conductors 23 and 24 has a terrace portion that does not overlap the other conductors 23 and 24. Specifically, they are formed in a manner described below. Each insulator 34 and the conductor 23 or 24 located on the upper surface of the insulator 34 constitute a conductor-insulator pair. The right end of each conductor-insulator pair located in a certain first layer is located on the right side of the right end of the conductor-insulator pair located in a second layer located one layer above the first layer. As a result, each of the conductors 23 and the conductors 24 has, at its end, a terrace portion which is not covered by another conductor-insulator pair. Each conductor 23 is thicker in the terrace portion than in the part other than the terrace portion.

Each support pillar GHR is located within and penetrates or passes through a structure consisting of an insulator 37, one or more conductors 24, one or more insulators 26, an insulator 35, one or more conductors 24, one or more insulators 34, a conductor 22, and an insulator 33. The lower surface of each support pillar GHR is located within the conductor 21. The support pillar GHR includes or is made of, for example, a silicon oxide.

The contacts GCC include contacts GCC_0, GCC_1, GCC_2, GCC_3, and GCC_4. The lower surfaces of the contacts GCC_0, GCC_1, GCC_2, GCC_3, and GCC_4 are in contact, at their lower surfaces, with the upper faces of the terrace portions of the conductors 24_0, 24_1, 24_2, 24_3, and 24_4, respectively. The contact GCC includes or is made of a conductor, and includes or is made of, for example, tungsten.

Each support pillar WHR is located within and penetrates or passes through a structure consisting of an insulator 37, one or more conductors 23, one or more insulators 34, a conductor 22, an insulator 33, and a conductor 21. The lower surface of each support pillar WHR is located within the conductor 21. The support pillar WHR includes or is made of, for example, a silicon oxide.

The contacts WCC include contacts WCC_0, WCC_1, WCC_2, . . . , WCC_n−1. Each contact WCC is located in the terrace portion of a single conductor 23 when viewed from the top surface. In other words, a single contact WCC is located within the terrace portion of each conductor 23, when viewed from the upper surface. The contact WCC is located within and penetrates or passes through a structure consisting of an insulator 37, one or more conductors 23, one or more insulators 34, a conductor 22, and an insulator 33. The lower surface of the contact WCC is located within the conductor 21. Each contact WCC has a shape of a pillar extending along the z-axis, for example, a cylindrical shape. The contacts WCC include or are made of a conductor, and includes or is made of, for example, tungsten.

An insulator WCI1 is provided on the lower surface and portions of the side surface of each contact WCC. The insulator WCI1 extends over the area between the contact WCC and the conductor 21. The insulator WCI1 covers, of the surface of the contact WCC, the part facing the conductor 21. The insulator WCI1 insulates the contact WCC from the conductor 21. The insulator WCI1 includes or is made of, for example, a silicon oxide.

One or more insulators WCI2 are provided on portions of the side surface of each contact WCC. The insulator WCI2 covers, of the side faces of each contact WCC, the portions facing the conductor 22 and the portions facing every conductor 23 except for a certain conductor 23. The insulator WCI2 insulates the contact WCC from the conductor 22, and insulates the contact WCC from the conductors 23 except for a certain conductor 23. The insulator WCI2 is not provided in, of the side surfaces of each contact WCC, an area between the contact WCC and the uppermost conductor 23 of the conductors 23 which this contact WCC penetrates or passes through. For this reason, each contact WCC is in contact, on its side surfaces, with the uppermost conductor 23 of the conductors 23 that this contact WCC penetrates or passes through. On the other hand, each contact WCC is insulated by the insulators WCI2 from all the conductors 23 except the single conductor 23. Thus, each contact WCC has an electrical connection with the uppermost conductor 23 of the conductors 23 that this contact WCC penetrates or passes through, and has no electrical connection with the other conductors 23 and the conductor 22.

Specifically, the contact WCC_2 is in contact only with the conductor 23_2 among the conductors 23. The contact WCC_1 is in contact only with the conductor 23_1 among the conductors 23. The contact WCC_0 is in contact only with the conductor 23_0 among the conductors 23. Hereinafter, the structure which includes a contact WCC which penetrates or passes through a plurality of conductors and has an electrical connection with a single conductor but not with the other conductors may be referred to as a "penetration-type" structure.

The insulators WCI2 include or are made of, for example, a silicon oxide.

Figure 10:
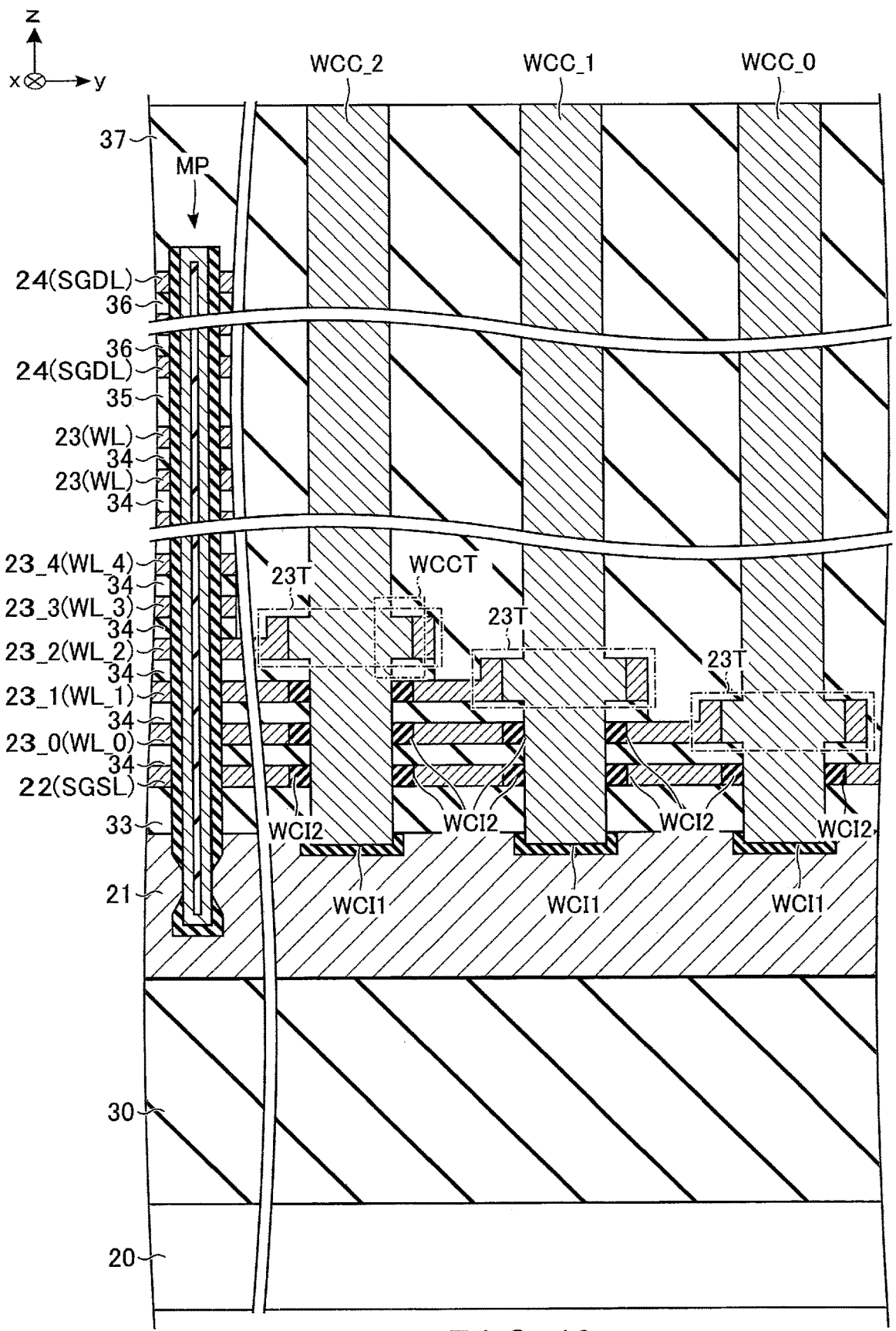
FIG. 10 schematically shows a cross-sectional structure of part of the memory cell array according to the first embodiment.

FIG. 10 shows in detail a cross-sectional structure of part of the memory cell area of the memory device according to the first embodiment. Specifically, FIG. 10 shows the memory pillars MP similarly to FIG. 5 and the contacts WCC. The support pillars WHR are omitted in FIG. 10.

As shown in FIG. 10, each conductor 23 includes a thick part 23T in the terrace portion of the conductor 23. The thick part 23T is thicker than the other parts in the conductor 23 (or, the part not included in the terrace portion). Each conductor 23 is in contact with a side surface of a single contact WCC in the inner part of the thick part 23T. The thick part 23T covers a part of the side surface of one contact WCC that intersects with the thick part 23T.

Each contact WCC has a larger diameter in the thick part 23T of the conductor 22 with which the contact WCC is in contact. In other words, the contact WCC has a part WCCT in the thick part 23T of the conductor 22 with which the contact WCC is in contact. The part WCCT projects toward the outside of the contact WCC from the side surface of the other part of the contact WCC. Each contact WCC is in contact with a single conductor 22 on the side surface of the part WCCT.

1.2 Manufacturing Method

Figure 23:
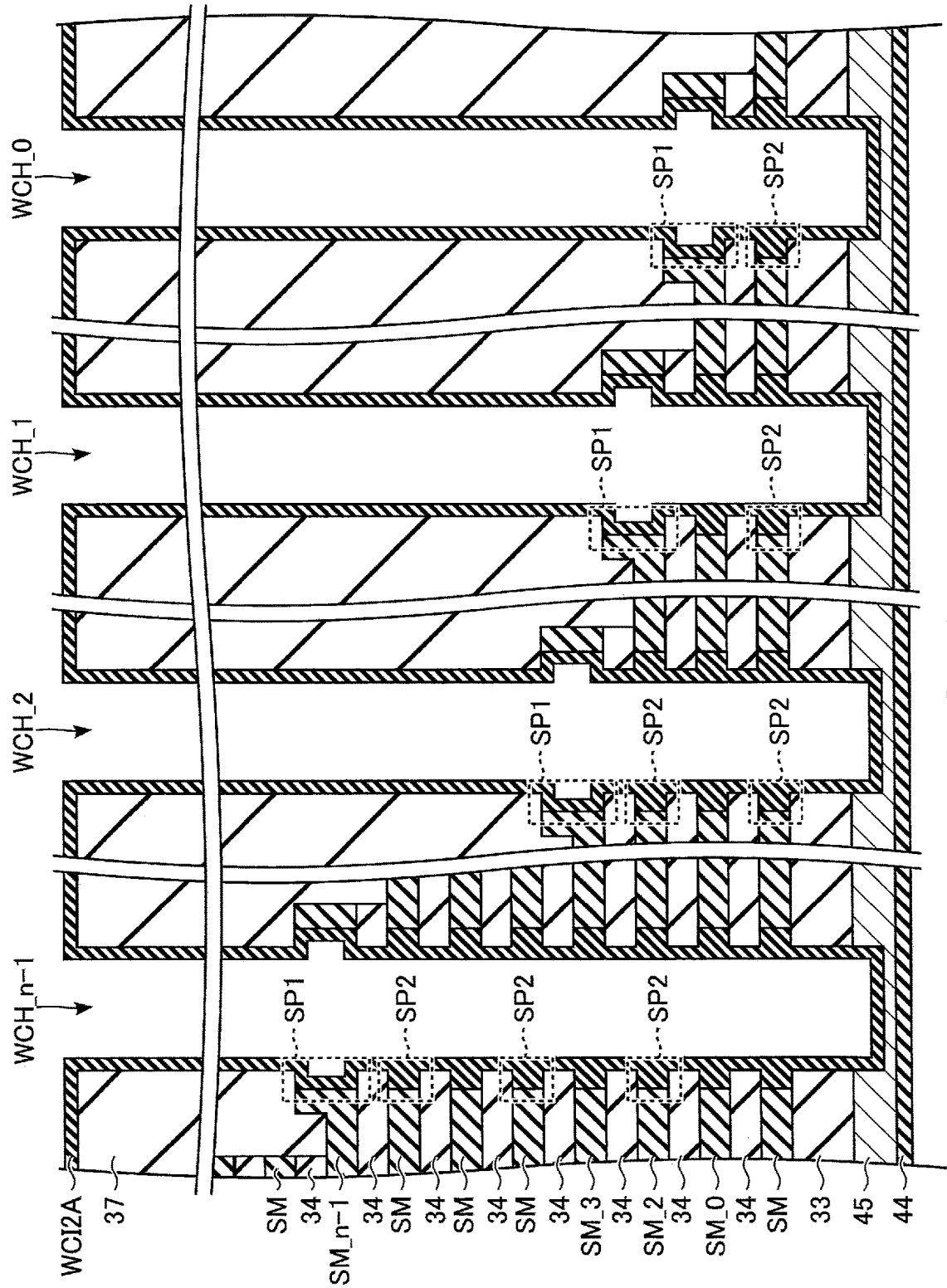
Figure 24:
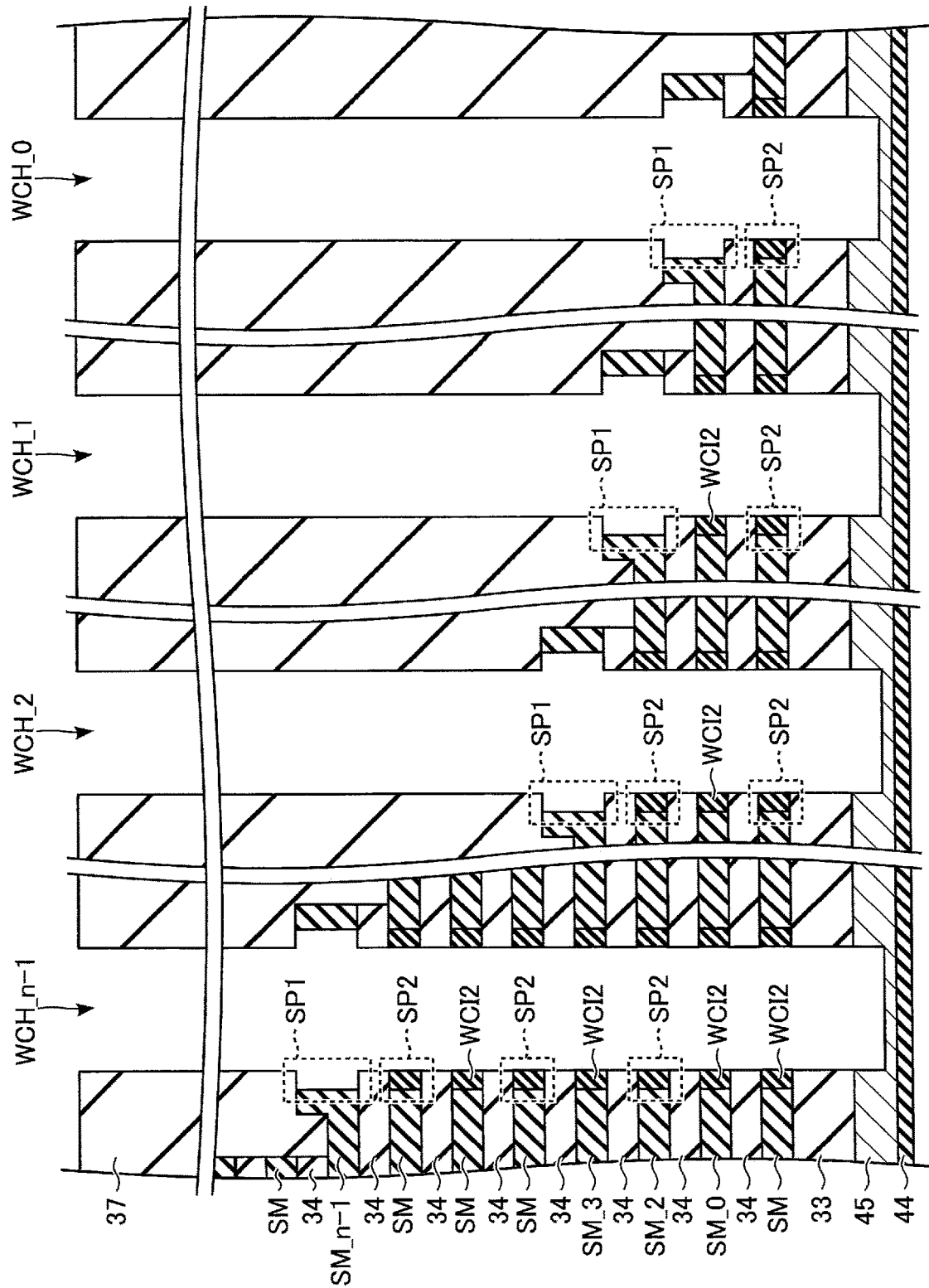

FIGS. 11 to 34 schematically show states of the memory device according to the first embodiment during a manufacturing process. FIGS. 14, 16, 18, 20, 25, 30, 31, and 33 show the structure of the plane of the same area as that shown in FIG. 7. FIGS. 11, 12, 13, 15, 17, 19, 21, 26, 27, 28, 29, 32, and 34 show the structure of the cross section of the same area as that shown in FIG. 9. FIGS. 22, 23, and 24 show the enlarged structure of the cross section of the same area as that shown in FIG. 9.

Figure 11:
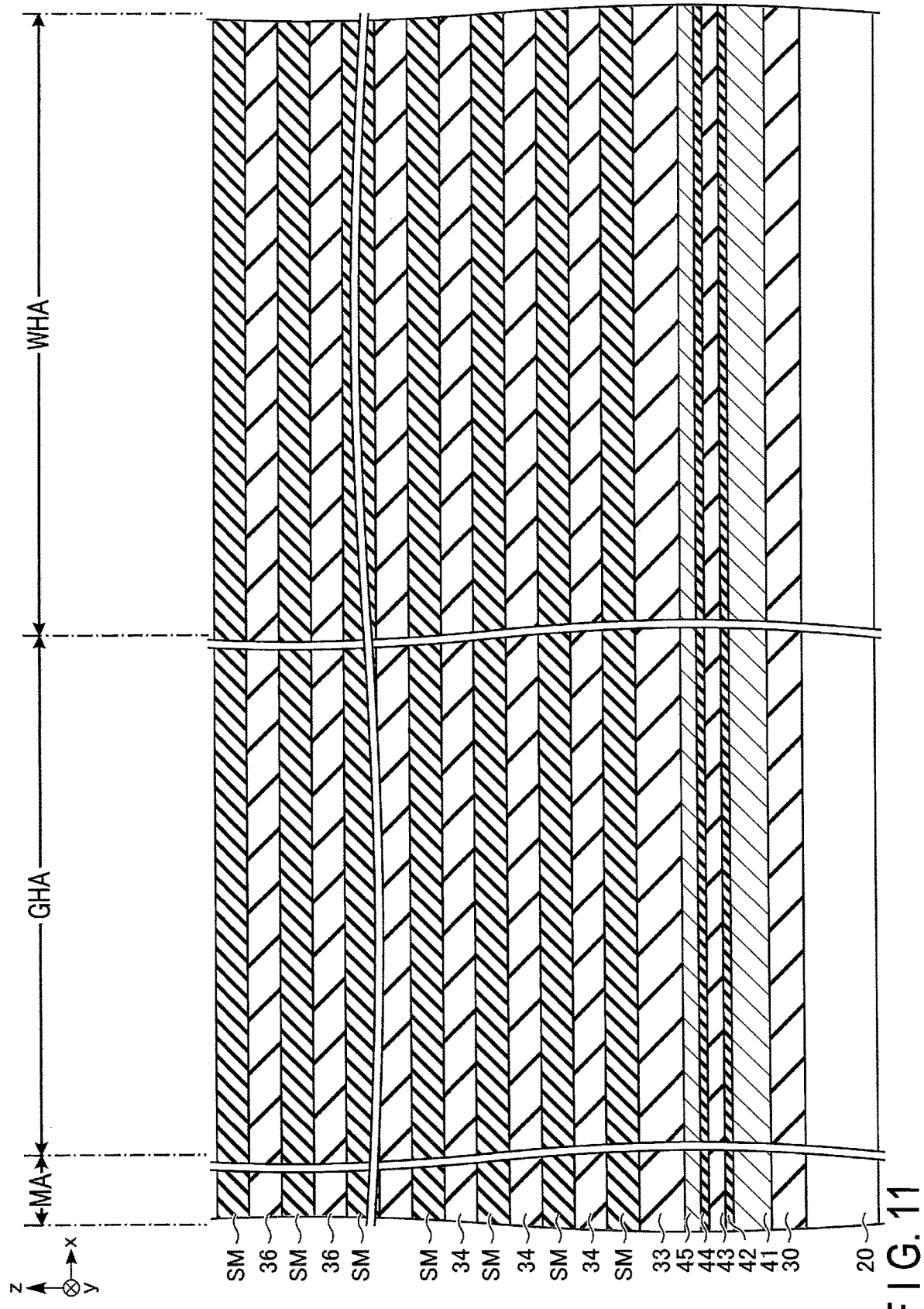
FIGS. 11, 12, and 13 each shows a cross-sectional structure of part of the memory cell area according to the first embodiment during a manufacturing process.

As shown in FIG. 11, after circuits (not shown) are formed on the substrate 20, an insulator 30, a conductor 41, insulators 42, 43, and 44, and a conductor 45 are deposited in this order on the upper surface of the substrate 20. A set of the conductor 41, the insulators 42, 43, and 44, and the conductor 45 occupies the area in which the conductor 21 is slated to be formed.

An insulator 33 is formed on the upper surface of the conductor 45.

On the upper surface of the insulator 33, a single insulator SM and a single insulator 34 are alternately deposited for multiple layers. The lowermost insulator SM occupies the area in which the conductor 22 is slated to be formed. An insulator 35 (not shown) is formed on the upper surface of the uppermost insulator SM, and insulators SM and insulators 36 are alternately deposited for a plurality layers on the upper surface of the insulator 35. The insulators SM occupy the areas in which the conductors 24 are slated to be formed. The insulators SM located in the areas in which the conductors 23_0 through 23_n−1 are slated to be formed may be referred to as "insulators SM_0" to "insulator SM_n−1", respectively. The insulators SM include or are made of, for example, a silicon nitride. The deposition can be achieved through chemical vapor deposition (CVD) for example.

Figure 12:
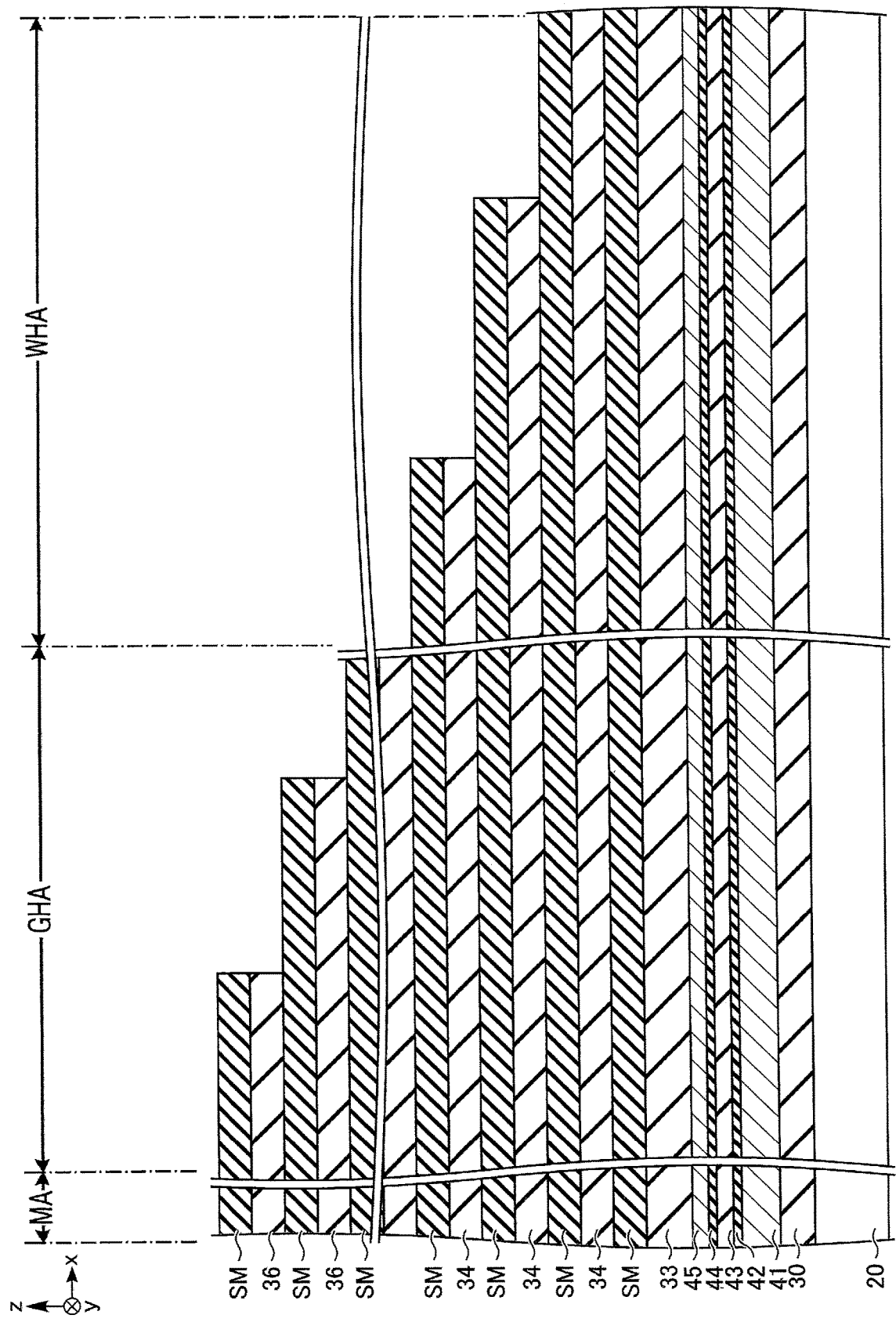

As shown in FIG. 12, the end of the structure consisting of the insulators 33, 34, 35, 36, and SM is formed in a form of a staircase. In other words, each insulator SM and the insulator 33, 34, or 36 that is in contact, at its upper surface, with the lower surface of this insulator SM constitute an insulator pair. Then, the upper surface of each of a first insulator pair is exposed by removing the edge part of a second insulator pair in the layer one layer above each first insulator pair. The exposed portion is a part slated to be processed into a terrace part of the conductor 23. The formation of the staircase structure can be achieved through photolithography and anisotropic etching such as reactive ion etching (RIE).

Figure 13:
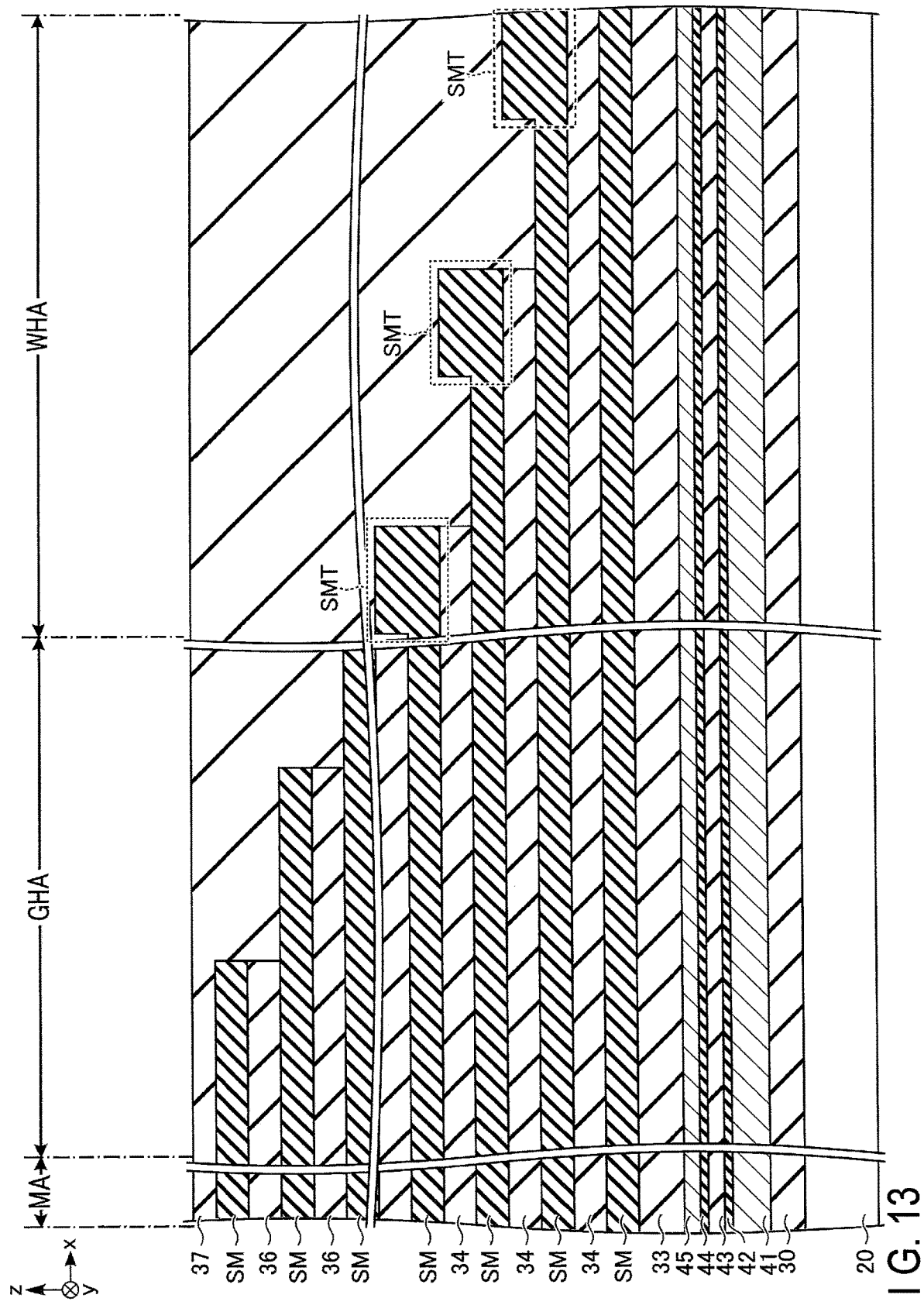

As shown in FIG. 13, the part of the insulator SM exposed within the WL hookup area WHA is thickened, and a thick part SMT is thus formed. The thick part SMT is a part slated to be processed into a thick part 23T of the conductor 23. The formation of the thick part SMT can be achieved by a discretionarily chosen method and can be achieved in the manner described below. An insulation film is formed on the entire surface of the structure obtained through the manufacturing steps up to the step shown in FIG. 12. The insulation film covers the exposed upper and side surfaces of each insulator pair. Subsequently, through partially removing the insulation film, the part on the side surface of each insulator pair in the insulation film remains unremoved. As a result, the upper surface of the insulator pair becomes exposed again. With this state, the same material as the insulator SM is deposited on the entire surface of the structure obtained through the manufacturing steps so far, and thereafter, the insulation film on the side surface of the insulator pair is removed. As a result, with the plan shape of each insulator pair being maintained, the thick part SMT is formed.

Figure 14:
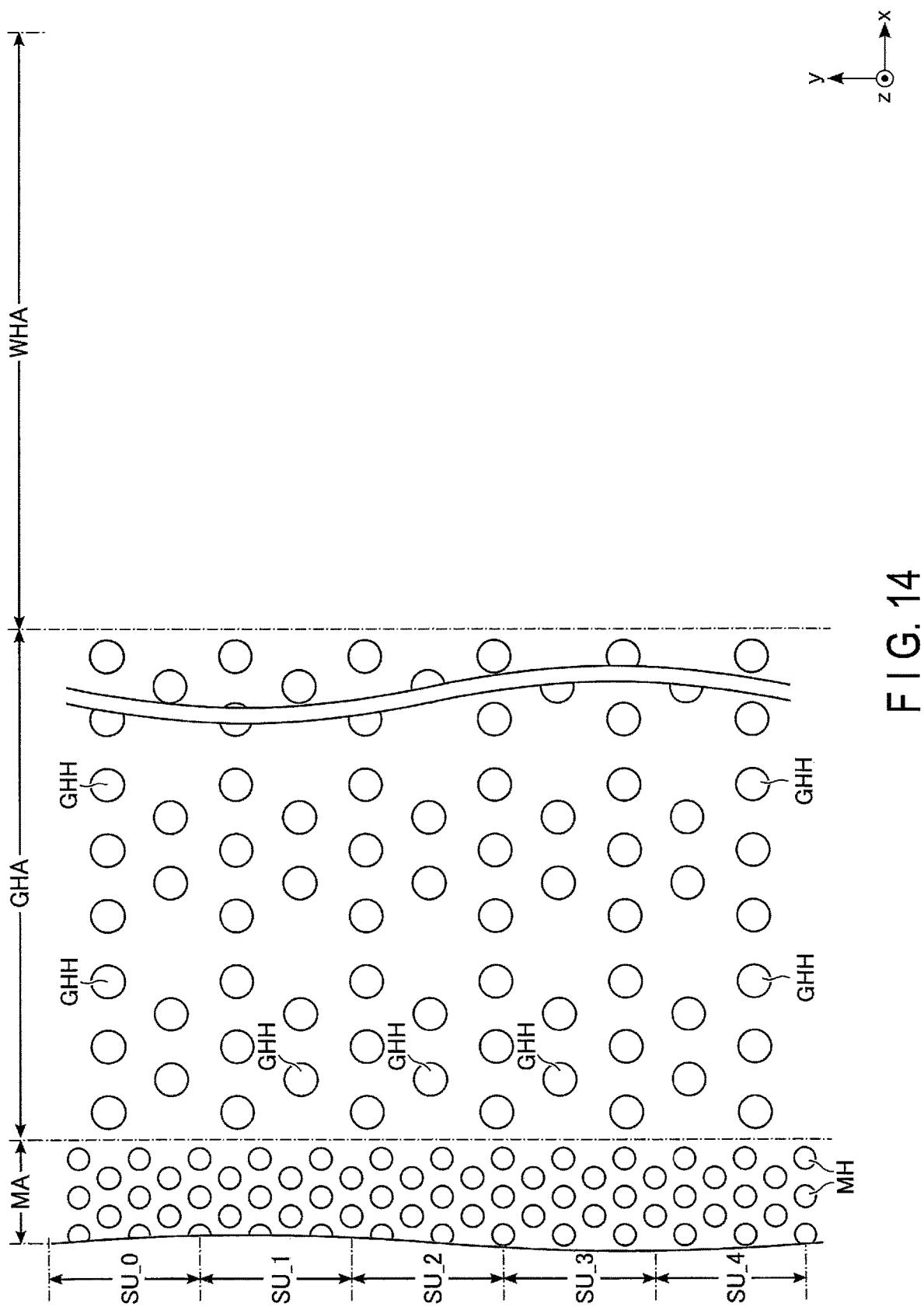
FIG. 14 shows a plane structure of part of the memory cell area according to the first embodiment during the manufacturing process.
Figure 15:
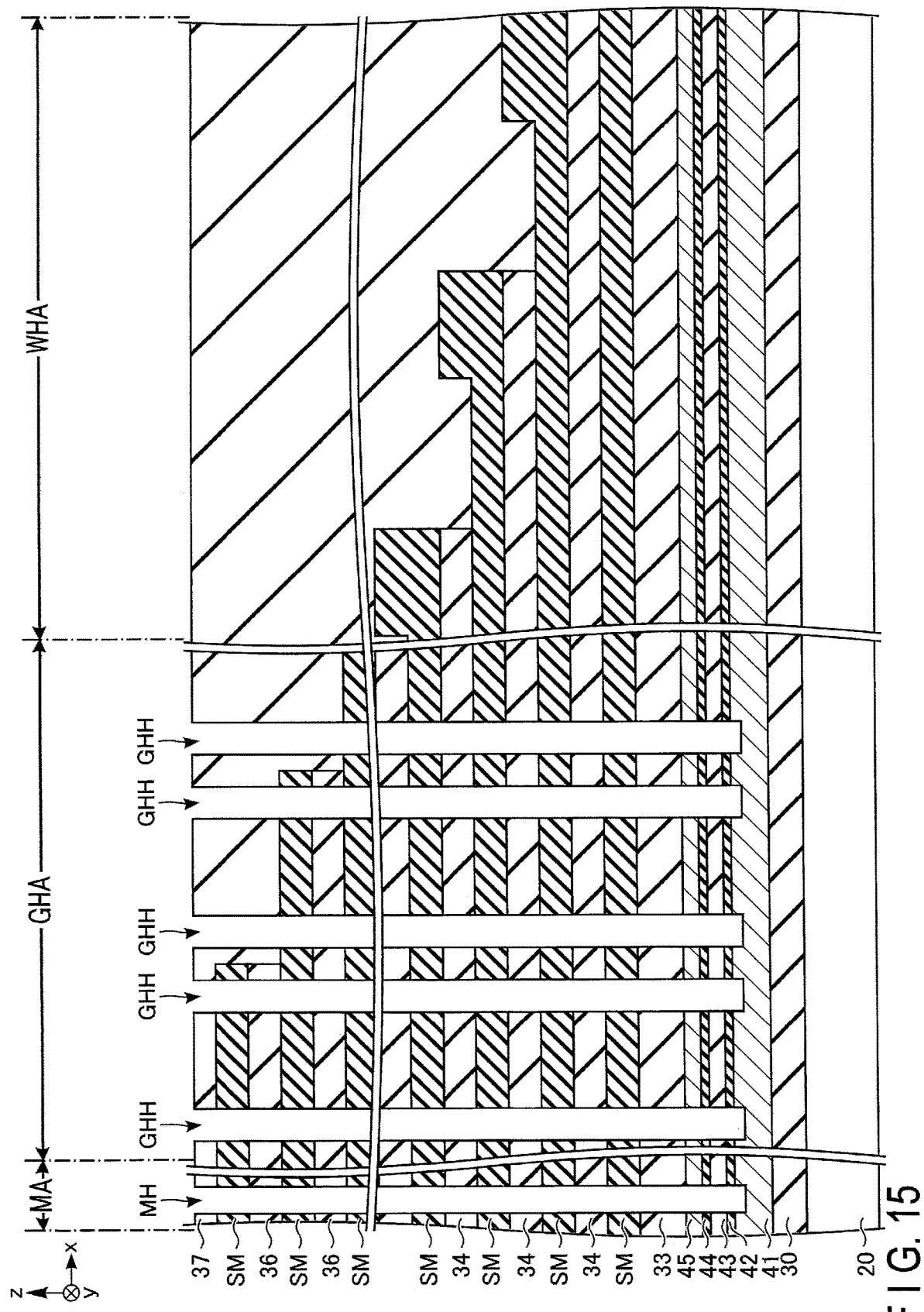
FIG. 15 shows a cross-sectional structure of part of the memory cell area according to the first embodiment during the manufacturing process.

As shown in FIGS. 14 and 15, the insulator 37 is formed on the structure obtained through the manufacturing steps so far, and the memory holes MH and the pillar holes GHH are subsequently formed. In other words, the insulators 37, SM, 36, 35, 34, and 33, the conductor 45, the insulator 44, the insulator 43, the insulator 42, and the conductor 41 are partially removed. The removal can be performed by photolithography step and anisotropic etching, such as RIE, etc. The memory holes MH are located at an area in which the memory pillars MP are slated to be formed. The pillar holes GHH are located at an area in which the support pillars GHR are slated to be formed. The memory holes MH and the pillar holes GHH reach inside of the conductor 41. In the step shown in FIGS. 14 and 15, holes for the contacts GCC within the SGDL hookup area GHA are not formed.

Figure 16:
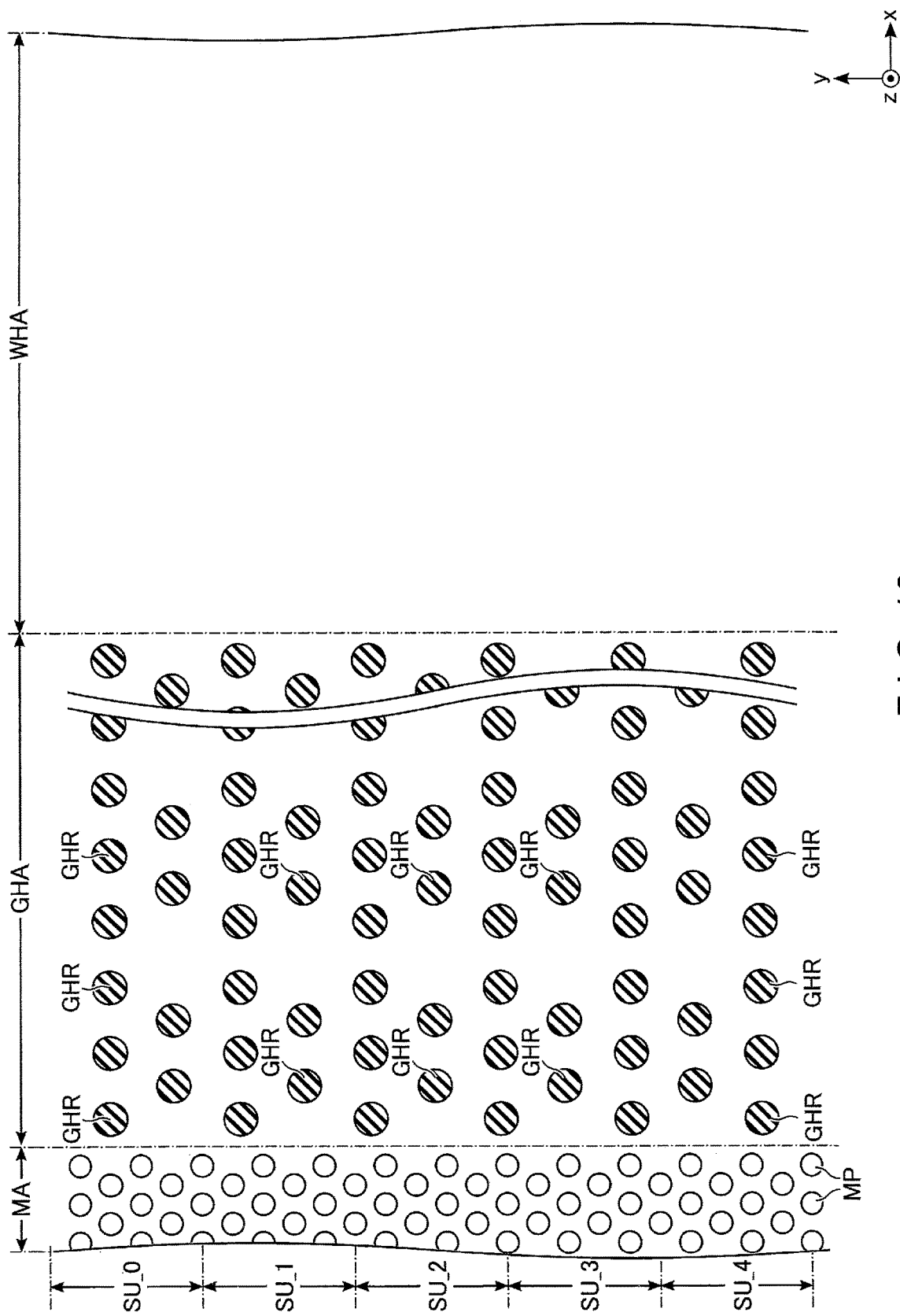
FIG. 16 shows a plane structure of part of the memory cell area according to the first embodiment during the manufacturing process.
Figure 17:
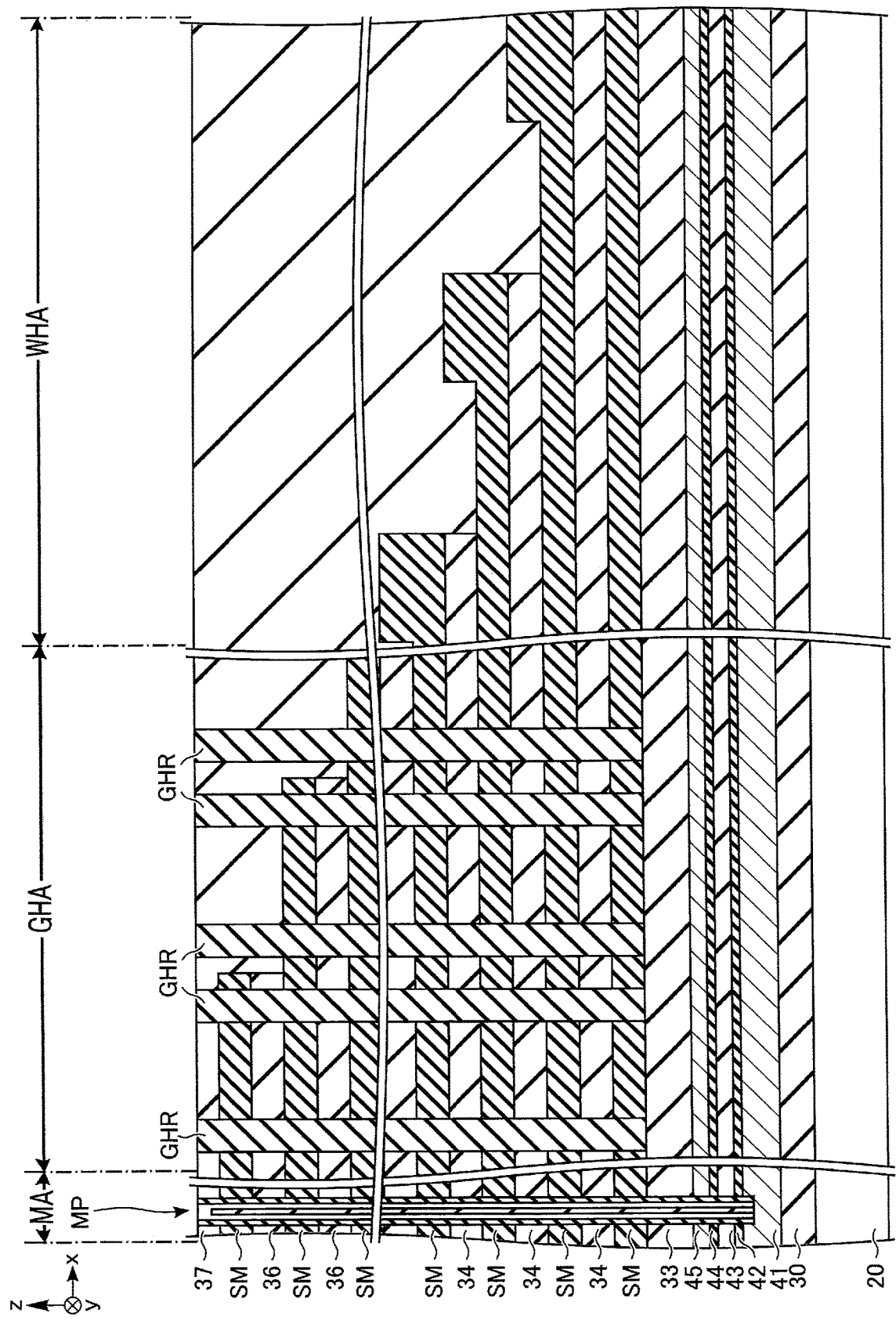
FIG. 17 shows a cross-sectional structure of part of the memory cell area according to the first embodiment during the manufacturing process.

As shown in FIGS. 16 and 17, the memory pillars MP are formed at the locations of the memory holes MH, and the support pillars GHR are formed at the locations of the pillar holes GHH. The formation can be achieved as described below as an example. First, the pillar holes GHH are buried with the material of the support pillars GHR, and the support pillars GHR are thereby formed. Subsequently, the memory pillars MP are formed. The side surface of the memory pillars MP, specifically the layer stack 52, does not have an opening at this stage, however. The details of the formation of the memory pillars MP are as described below. The layer stack 52, namely a tunnel insulator 53, a charge storage film 54, and a block insulator 55 are formed on the surface of the memory hole MH. A semiconductor 51 is formed on the surface of the layer stack 52. Through forming the core 50 on the surface of the semiconductor 51, the center of the memory hole MH is buried with the core 50. Thereafter, the upper part of the core 50 is removed, and the semiconductor 51 is formed in the removed part.

Figure 18:
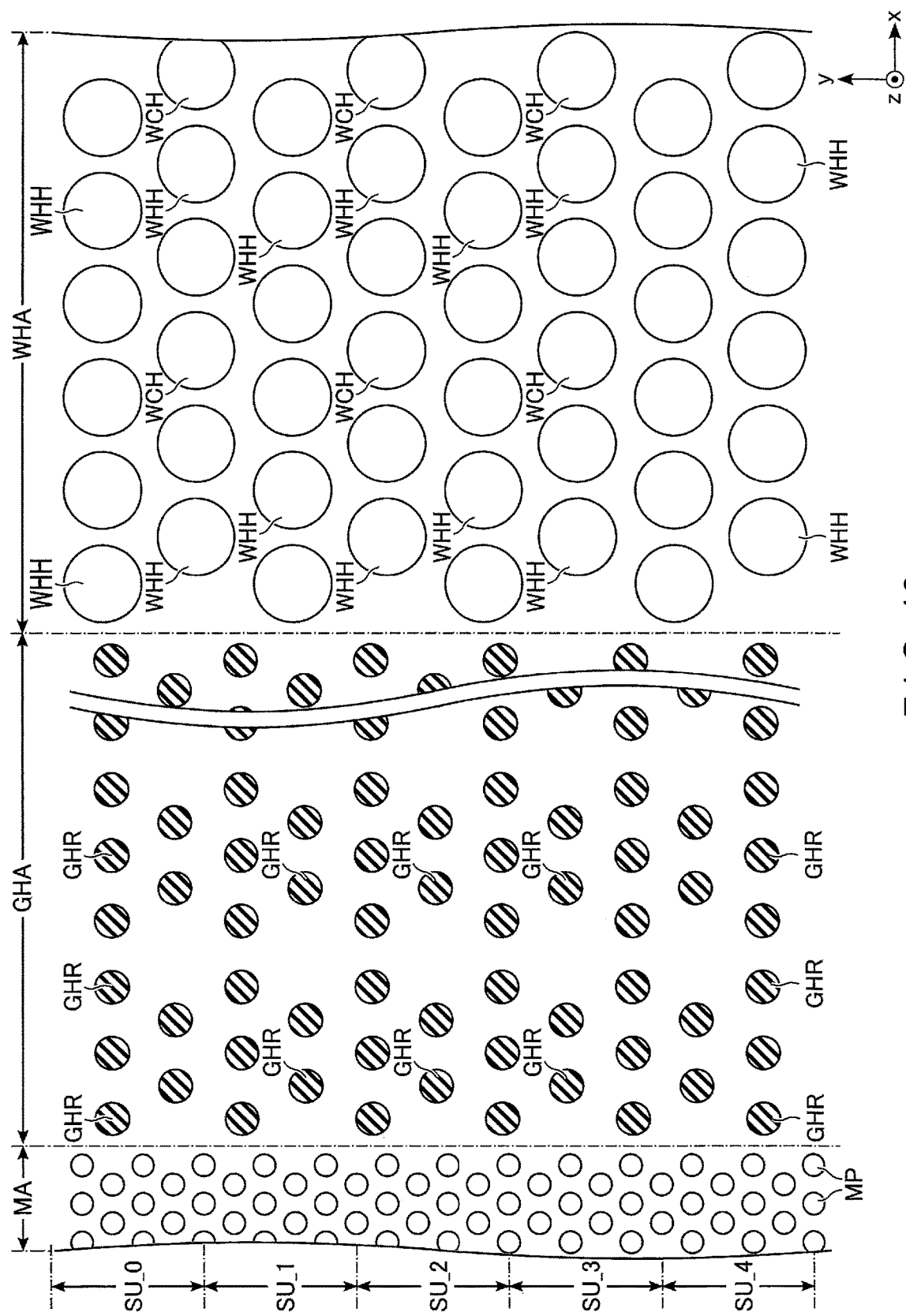
FIG. 18 shows a plane structure of part of the memory cell area according to the first embodiment during the manufacturing process.
Figure 19:
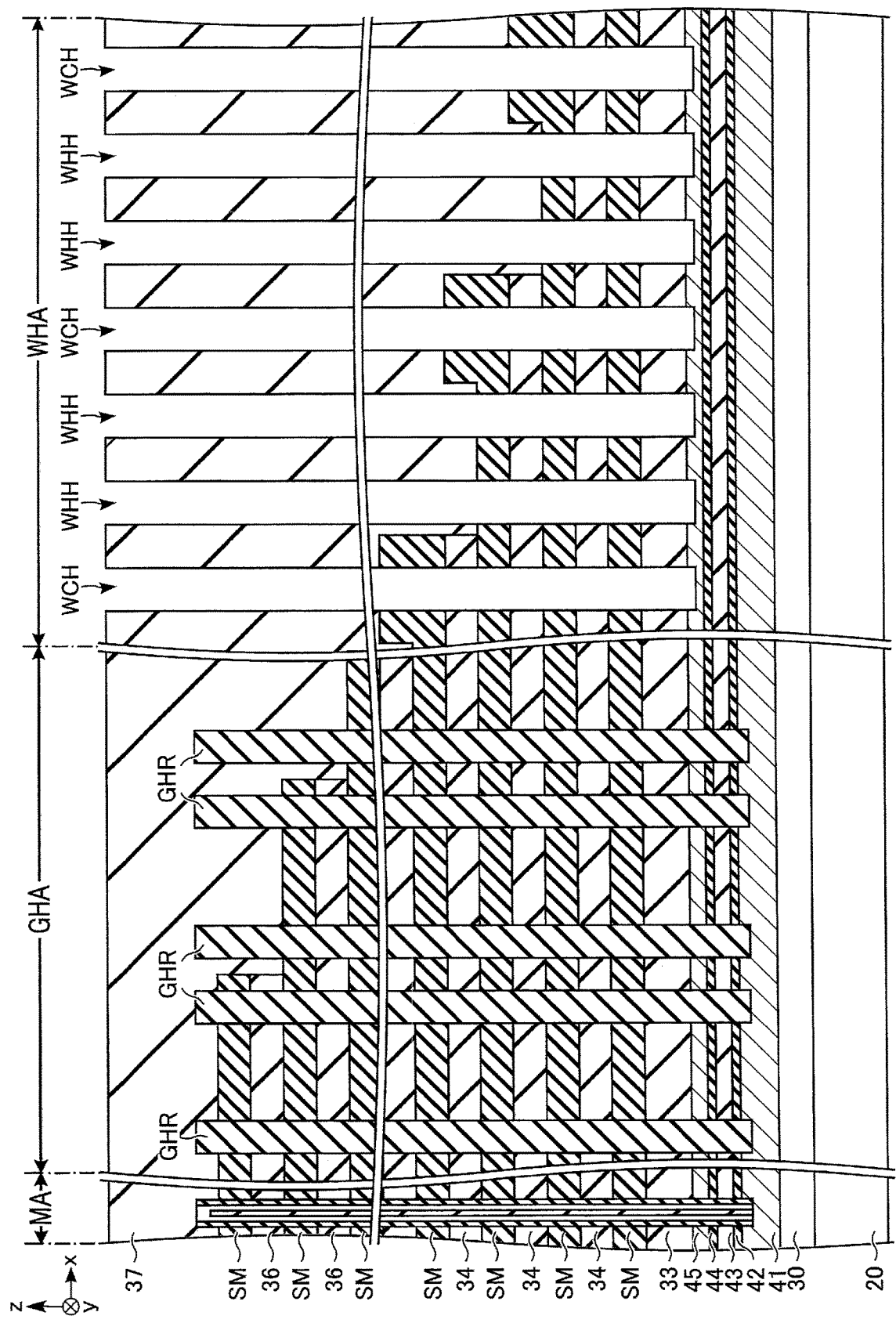
FIG. 19 shows a cross-sectional structure of part of the memory cell area according to the first embodiment during the manufacturing process.

As shown in FIGS. 18 and 19, the insulator 37 is thickened, and the contact holes WCH and the pillar holes WHH are formed. In other words, the insulator 37, some insulators SM, the insulators 34 and 33, and the conductor 45 are partially removed. The removal can be performed by photolithography and anisotropic etching such as RIE, etc. The contact holes WCH are located at an area in which the contacts WCC are slated to be formed. The pillar holes WHH are located at an area in which the support pillars WHR are slated to be formed. The memory holes MH and the pillar holes GHH reach inside of the conductor 45.

Figure 21:
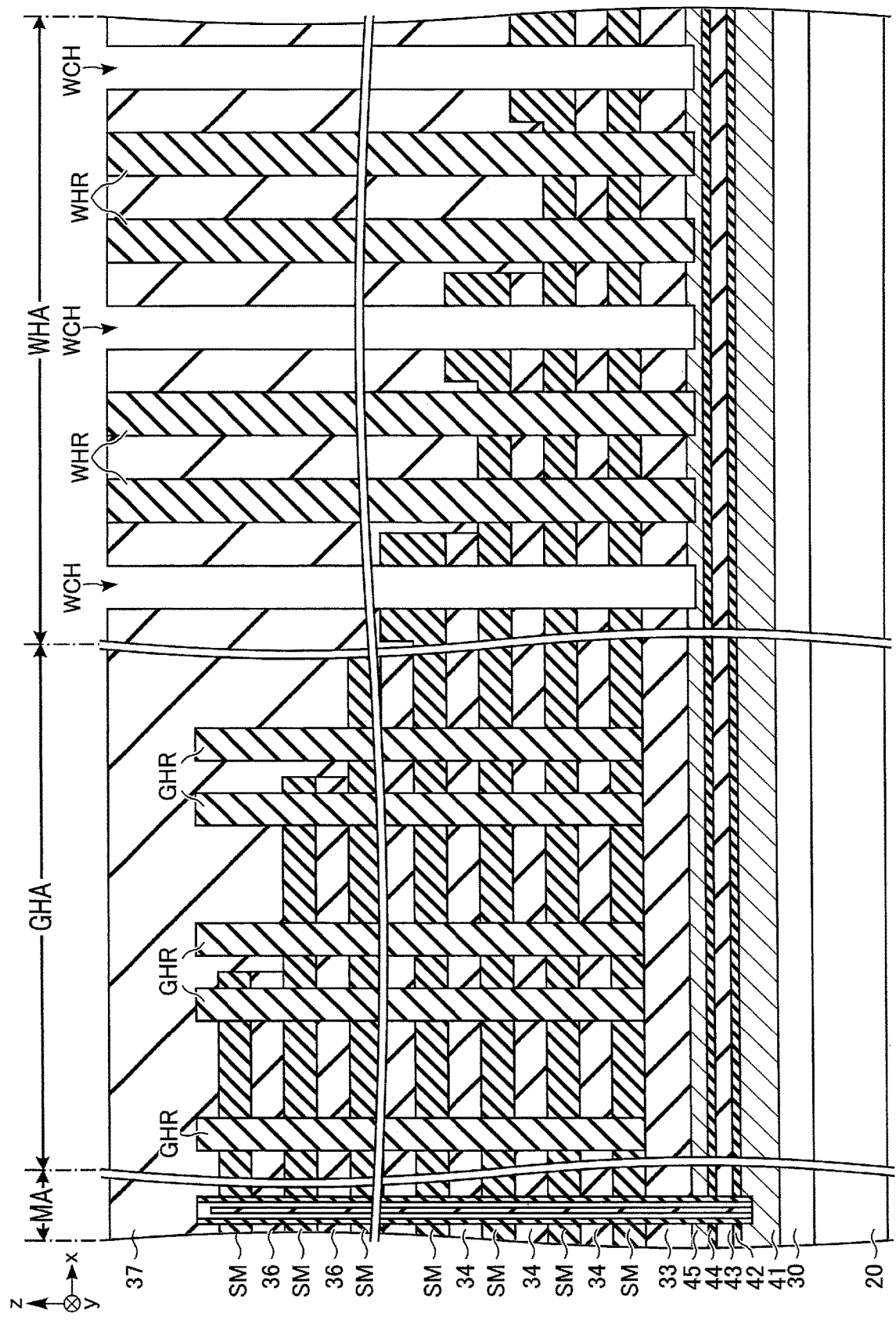

As shown in FIGS. 20 and 21, the support pillars WHR are formed. In other words, the pillar holes WHH are buried with the material of the support pillars WHR, and the support pillars WHR are thereby formed at the locations of the pillar holes WHH. The embedding can be achieved by CVD, for example.

As shown in FIG. 22, the contact holes WCH are partially broadened. In other words, the parts of the insulator SM being exposed in each contact hole WCH are removed. The contact holes WCH for the contacts WCC_0 to WCC_n−1 may be referred to as "contact hole WCH_0" to "contact hole WCH_n−1", respectively. The removal may be achieved by wet etching, for example. As a result of removing the portions of the thick part SMT in each insulator SM exposed in the contact holes WCH, the space SP1 is formed in the removed area. As a result of removing the portions of the insulator SM in each insulator SM exposed in the contact holes WCH other than the thick part SMT, the space SP2 is formed in the removed area. Since the thick part SMT of the insulator SM is thicker than the other part, the height of the space SP1 (or, length in the z-axis direction) is larger than the height of the space SP2.

As shown in FIG. 23, an insulation film WCI2A is deposited on the inner surfaces of the contact holes WCH. The deposition can be achieved through CVD for example. The insulation film WCI2A covers, of the inner surfaces of the contact holes WCH, the surfaces of the insulators 37, 34, and 33 and the conductor 45. The insulation film WCI2A is also deposited in the space SP1 and SP2. Since the space SP1 is large, the insulation film WCI2A does not fill up the space SP1. In other words, in the space SP1, the portions where the insulation film WCI2A is deposited on the surfaces of the insulators 37, SM, and 34 leave space in the space SP1. Since the space SP2 is small, the space SP2 is filled up by the insulation film WCI2A. The insulation film WCI2A has a thickness that can fill up the space SP2 even when it does not fill up the space SP1.

As shown in FIG. 24, the insulation film WCI2A is formed into an insulator WCI2. In other words, the insulation film WCI2A is partially removed. The removal may be achieved by wet etching, for example. By the removal, the portions of the insulation film WCI2A on the surfaces of the insulators 37, 34, 33, and the conductor 45 in the contact holes WCH are removed. By the removal, the portions of the insulation film WCI2A in the space SP1 are removed, and the insulators SM are exposed in the space SP1. Even by this removal, the portions of the insulation film WCI2A in the space SP2 are not removed. For this reason, the insulators SM are not exposed in the space SP2.

As a result of the step shown in FIG. 24, in each contact hole WCH, the uppermost insulator SM among the plurality of insulators SM through which the contact hole WCH penetrates is exposed, and the rest of the insulators SM are not exposed. In other words, the contact holes WCH_0 to WCH_n−1 are in contact with the insulators SM_0 through SM_n−1 respectively, and not in contact with the insulators SM below the insulators SM that the contact holes are in contact with.

Figure 26:
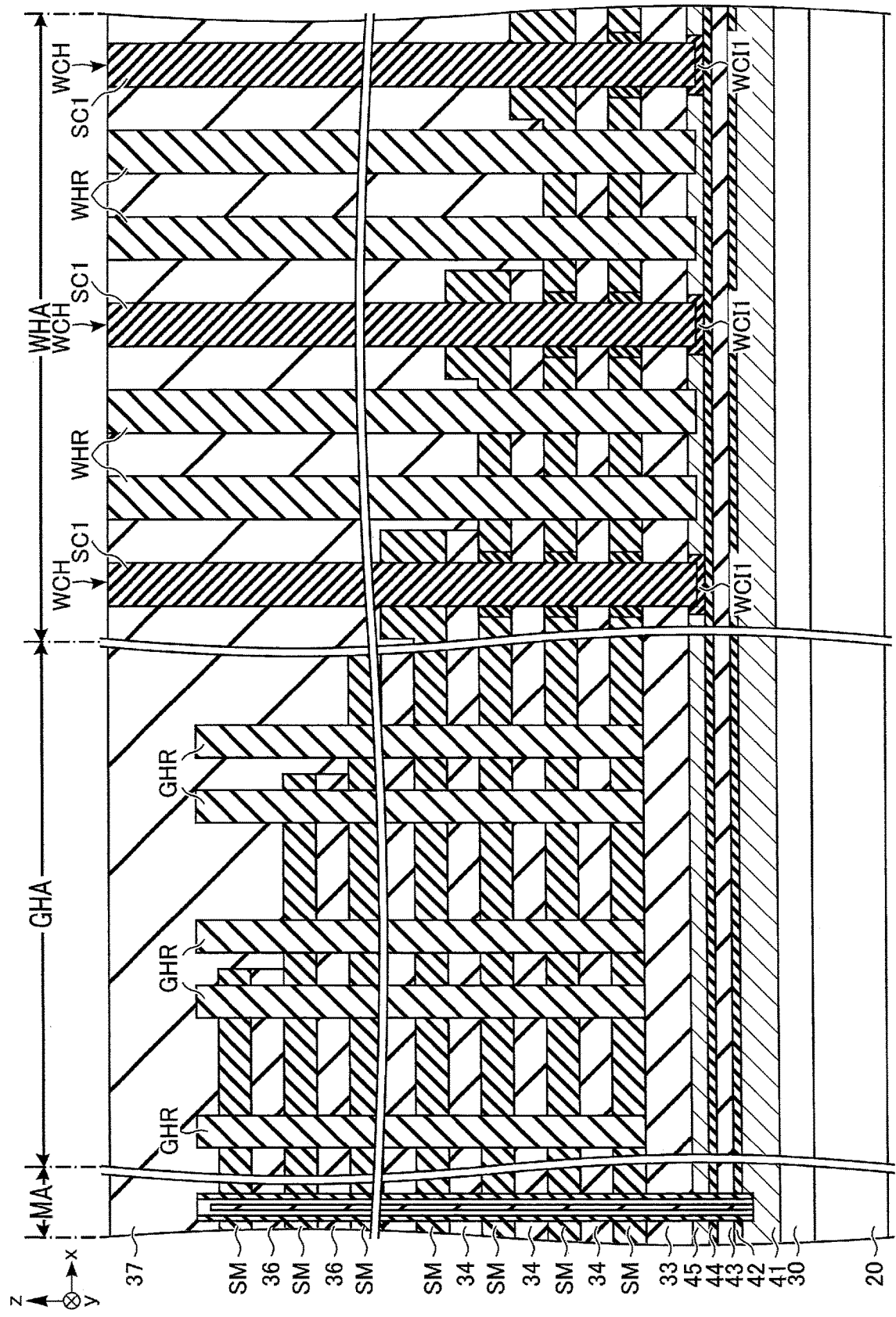
FIGS. 26, 27, 28, and 29 each shows a cross-sectional structure of part of the memory cell area according to the first embodiment during the manufacturing process.

As shown in FIGS. 25 and 26, insulators WCI1 and sacrificial members SC1 are formed. In other words, for example, the parts of the conductor 45 being exposed in each contact hole WCH are oxidized, and the insulators WCI1 are thereby formed in the oxidized parts. Next, the contact holes WCH are buried with the sacrificial member SC1. The sacrificial member SC1 is an insulator, for example, and is made of a material different from that of the insulator 37.

Figure 27:
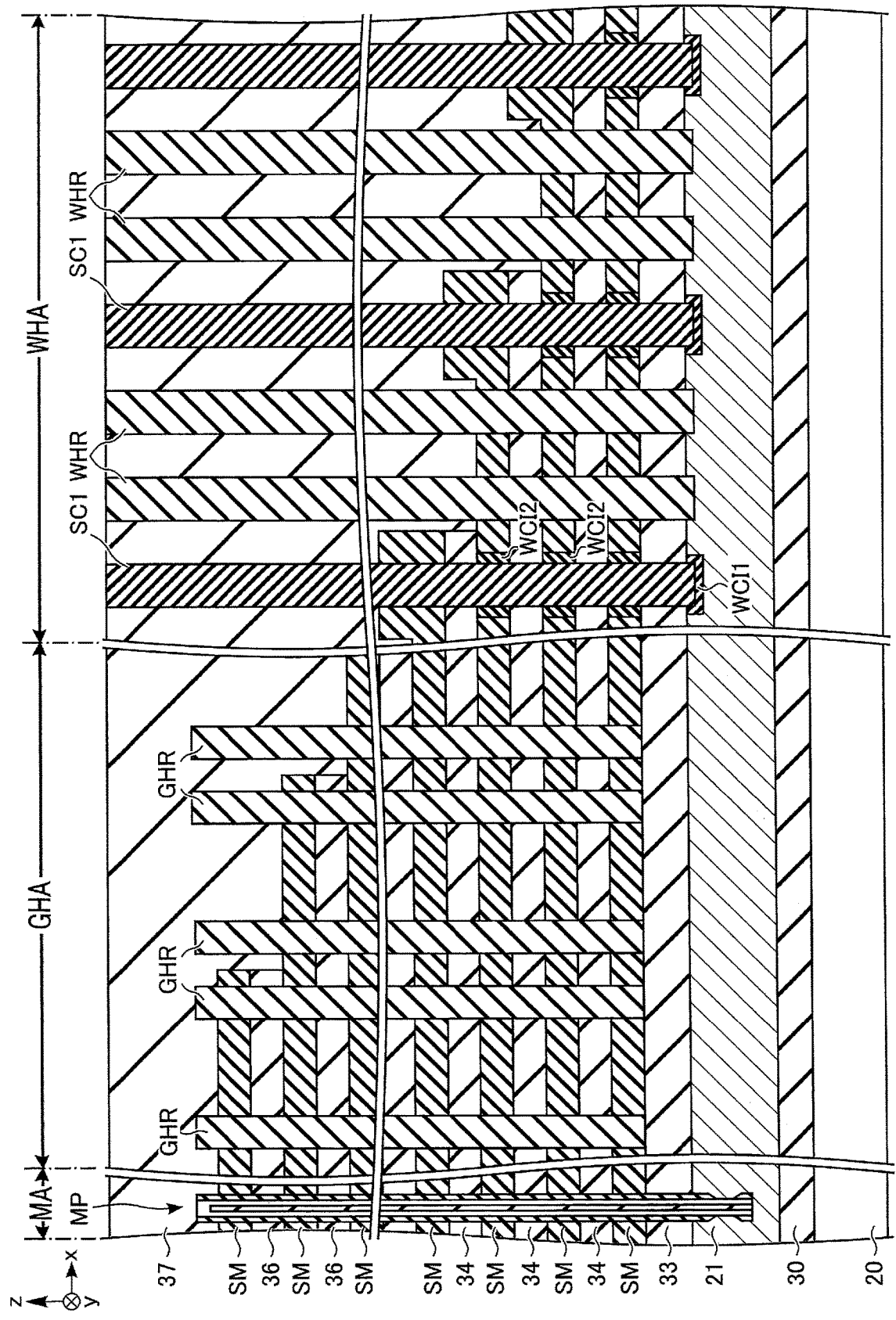

As shown in FIG. 27, with the conductor 21 being formed, the parts located in the conductor 21 on the side surface of the memory pillar MP are removed. In other words, by photolithography and anisotropic etching such as RIE, a slit is formed in the area in which the member SLT is slated to be formed. The bottom of the slit reaches the upper surface of the insulator 43. Subsequently, wet etching is performed. The chemical solution travels from the bottom of the slit and removes the insulator 43 and also removes part of the side surface of the memory pillars MP, in other words, the part located at the layer of the insulator 43 in the layer stack 52. As a result, the semiconductors 51 in the memory pillars MP are exposed. Further, the insulators 42 and 44 are removed by a chemical solution that travels from the bottom of the slit. By burying the space where the insulators 42 and 44 were located, the conductor 21 is formed.

Figure 28:
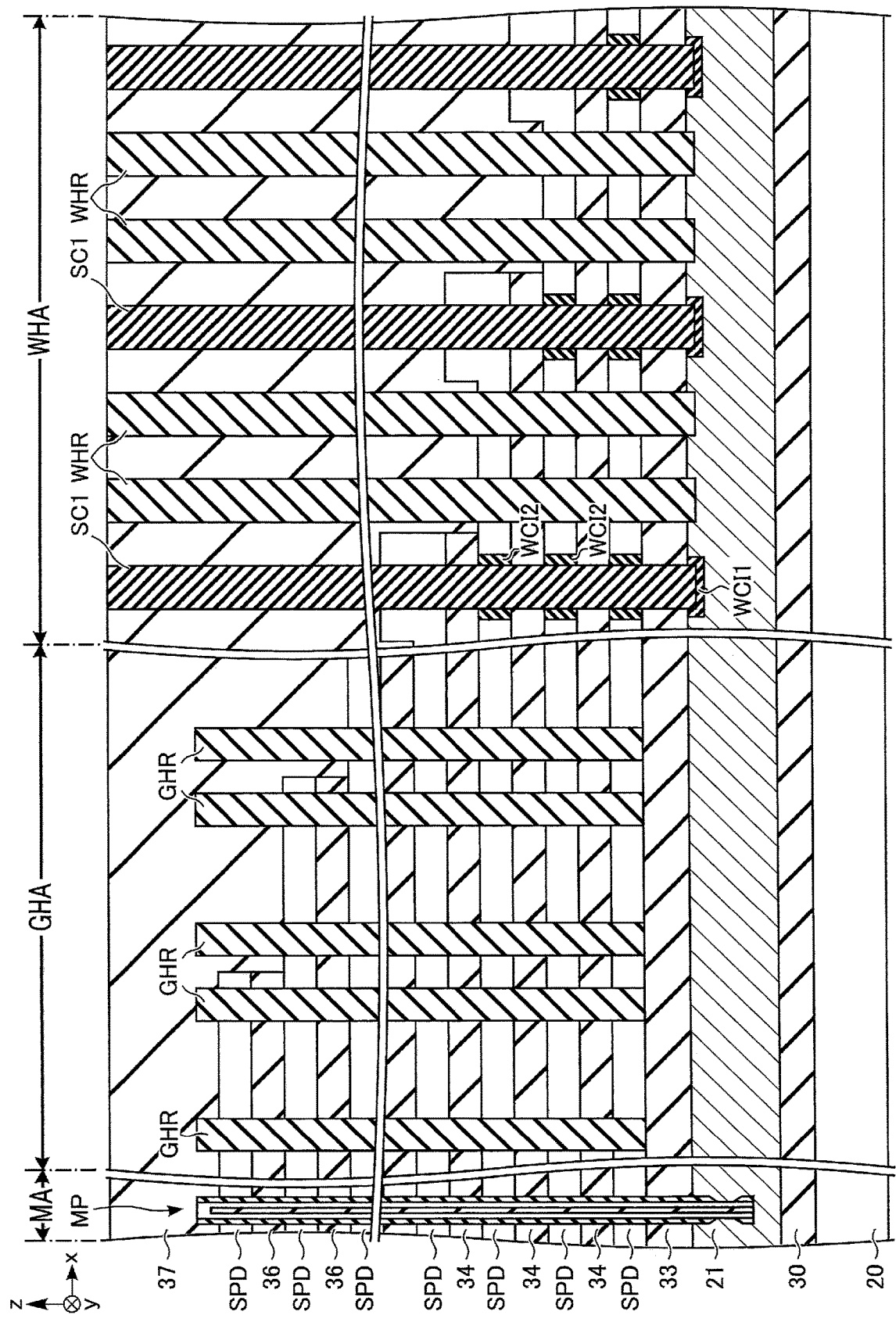

As shown in FIG. 28, the insulators SM are removed. In other words, wet etching is performed, and the parts of the insulators SM being exposed in the slit are subjected to the chemical solution. The advance of the chemical solution removes the insulators SM. As a result, the space SPD is formed in the areas where the insulators SM were located.

Figure 29:
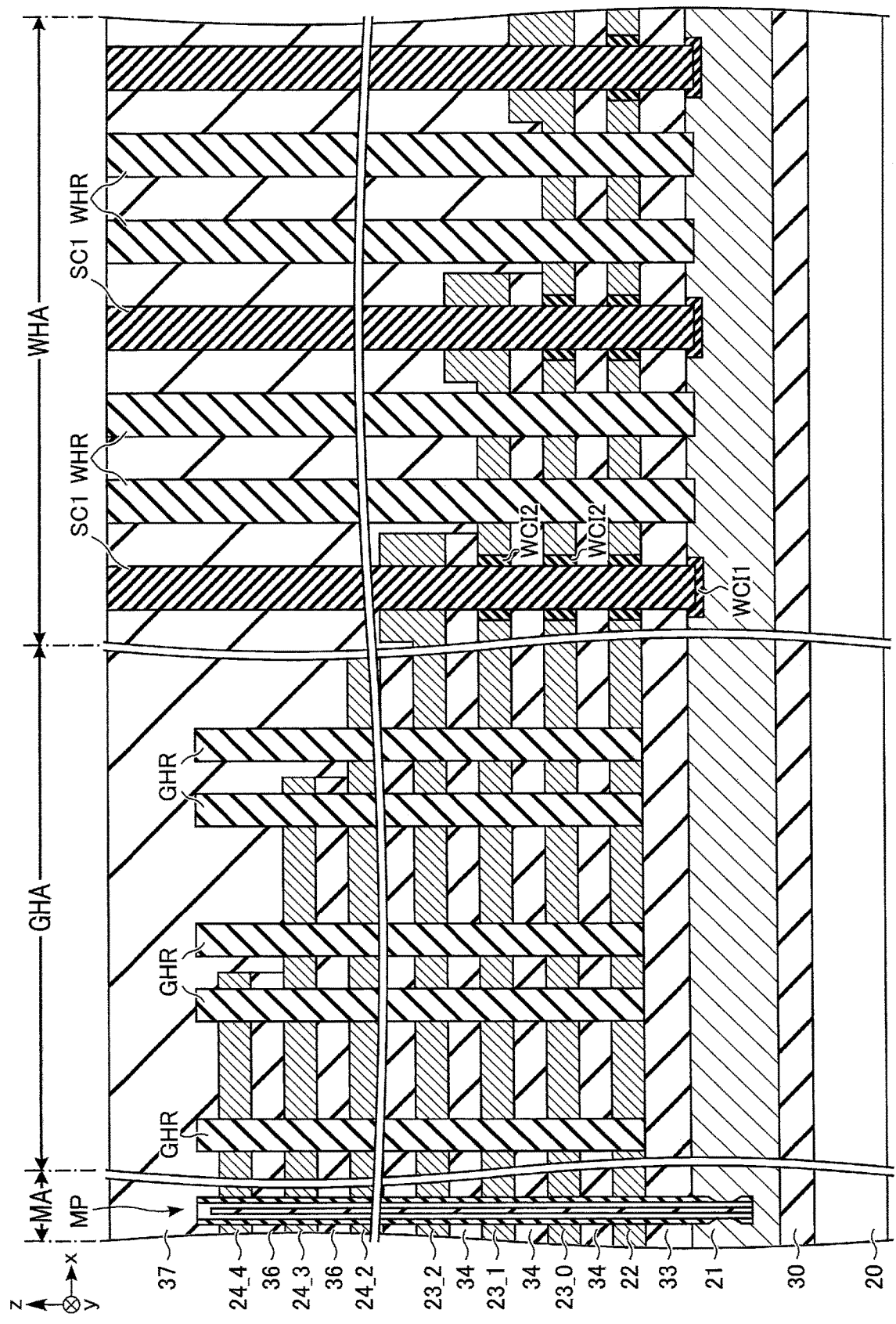

As shown in FIG. 29, the material of the conductors 22, 23, and 24 are filled in the space SPD. The conductors 22, 23, and 24 are thereby formed in the area where the insulators SM were located. The slit is buried with the insulator and conductor, and it thereby becomes a member SLT.

Figure 30:
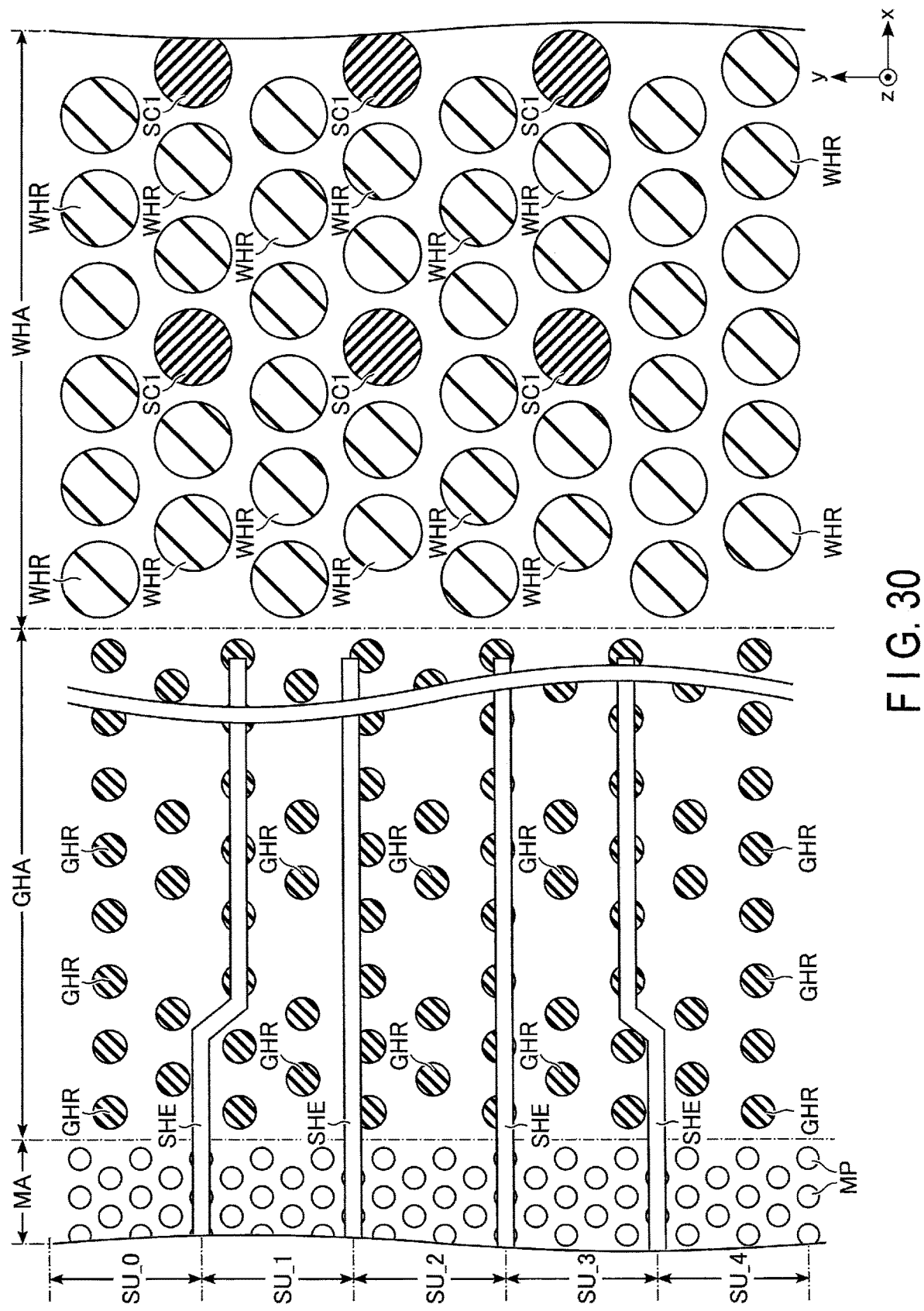
FIGS. 30 and 31 each shows a plane structure of part of the memory cell area according to the first embodiment during the manufacturing process.

As shown in FIG. 30, the members SHE are formed. In other words, trenches are formed by anisotropic etching, such as lithography and RIE, etc., in the area in which the members SHE are slated to be formed. The trenches penetrate the conductors 24, the insulators 36, and a part of the insulator 37. Subsequently, the trenches are buried with the material of the members SHE, and the members SHE are thereby formed at the location of the trench.

Figure 31:
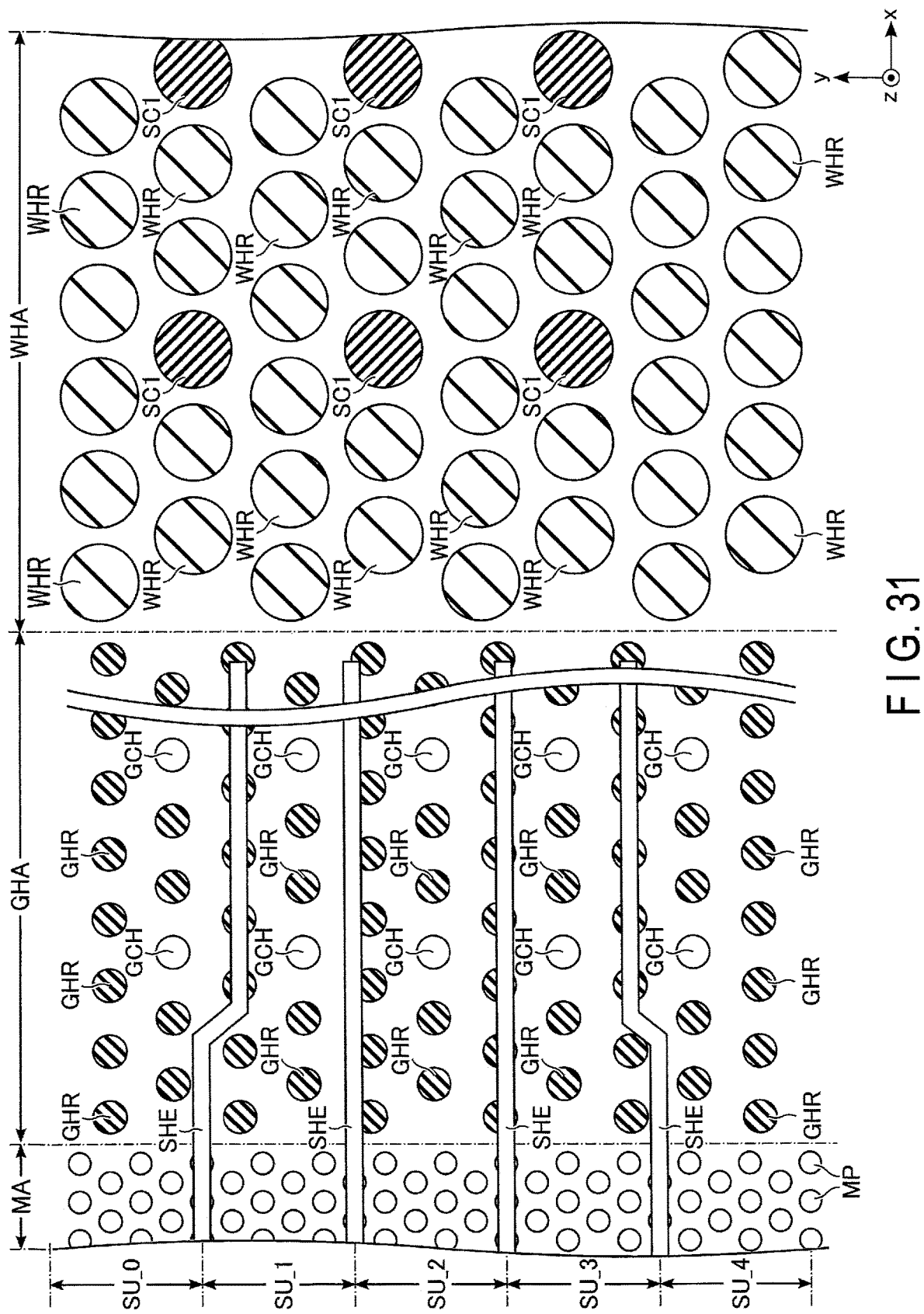

As shown in FIGS. 31 and 32, the contact holes GCH are formed. In other words, the insulator 37 is partially removed by photolithography and anisotropic etching such as a RIE, etc. The contact holes GCH are located at an area in which the contacts GCC are slated to be formed. Each contact hole GCH reaches an upper surface of a single conductor 24 that the contact hole GCH is slated to be in contact with.

Figure 33:
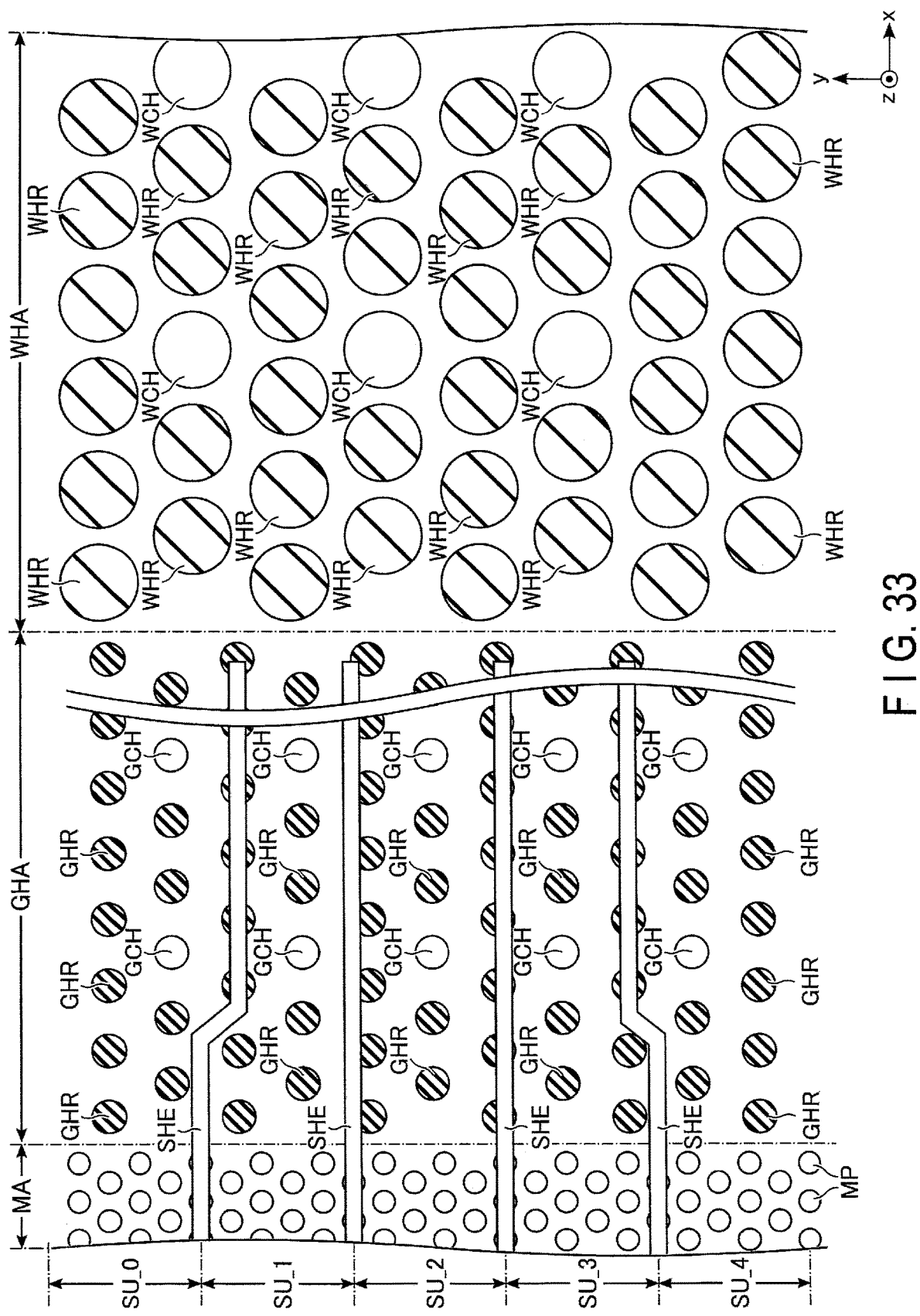
FIG. 33 shows a plane structure of part of the memory cell area according to the first embodiment during the manufacturing process.
Figure 34:
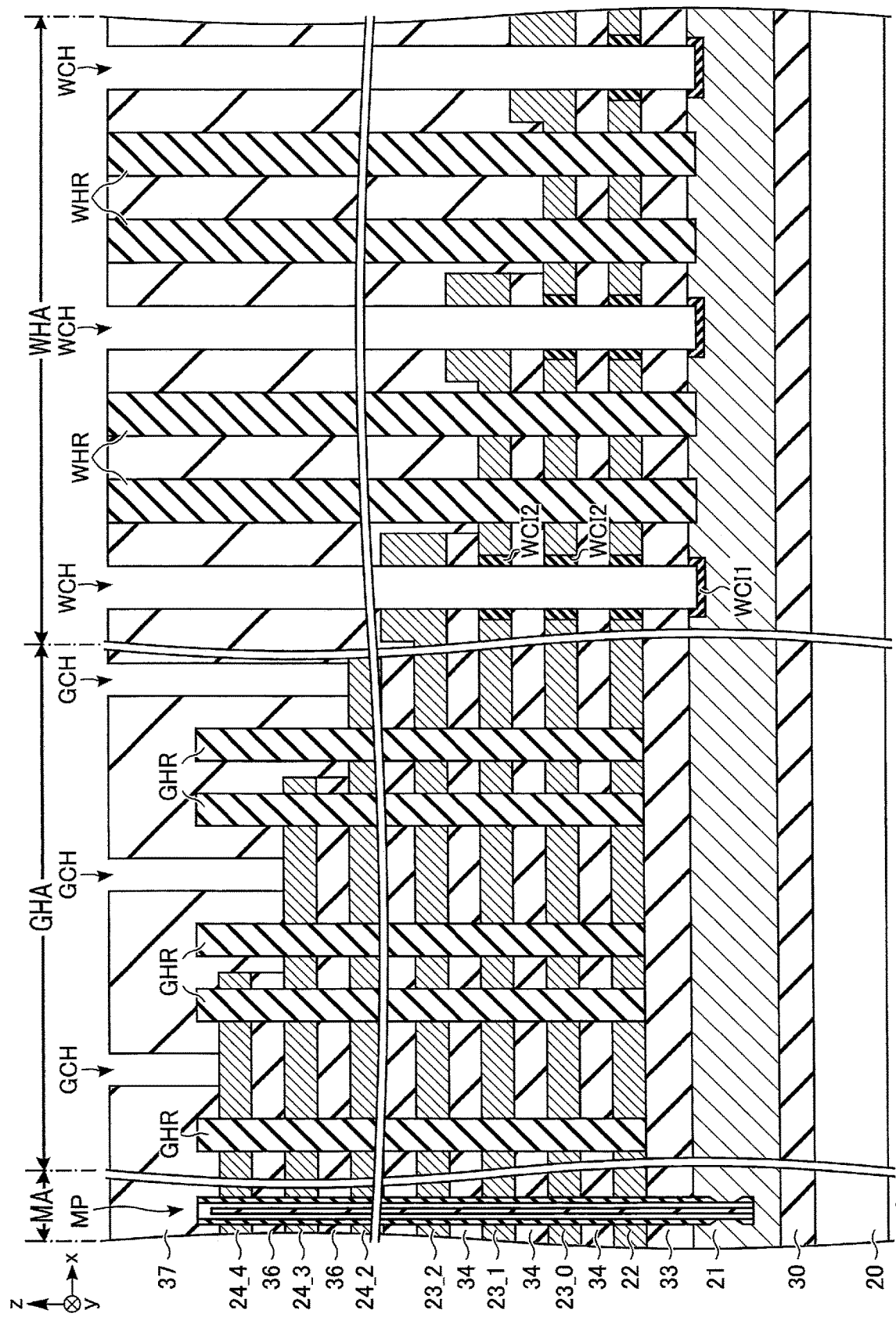
FIG. 34 shows a cross-sectional structure of part of the memory cell area according to the first embodiment during the manufacturing process.

As shown in FIGS. 33 and 34, the sacrificial members SC1 are removed. The removal can be achieved by wet etching, for example. The contact holes WCH are once again formed by the removal. Each contact hole WCH causes the conductors 23 that are not covered by the insulator WCI2 to be exposed within the contact hole WCH.

As shown in FIG. 9, the contact holes GCH and WCH are buried with the material of the contacts GCC and WCC. Through the burying, the contacts GCC and WCC are formed in the locations of the contact holes GCH and WCH, respectively. The material is deposited on the surface of the conductor 23 exposed in each contact hole WCH. The structure shown in FIG. 9 is completed by the manufacturing steps so far.

1.3. Advantages (Advantageous Effects)

According to the first embodiment, a memory device having a small area size can be provided, as described below.

To maintain the structure of the memory cell array, support pillars similar to the support pillars GHR and WHR may be provided. Such support pillars are formed in the same process during which memory holes such as the memory holes MH are formed for the sake of efficiency of the manufacturing process. The larger the diameter the support pillars is, the easier it is to maintain the structure of the memory cell array. Given that, it is possible to provide support pillars having a large diameter. If the diameters of the support pillars and the memory pillars are greatly different, it is impossible or extremely difficult to form the pillar holes for the support pillars in the same process in which the memory holes for the memory pillars are formed. This is because the periods and patterns on the plane along the xy-plane are greatly different between the pillar holes and the memory holes. For this reason, the formation of the support pillars increases the number of manufacturing steps for the memory device.

Figure 35:
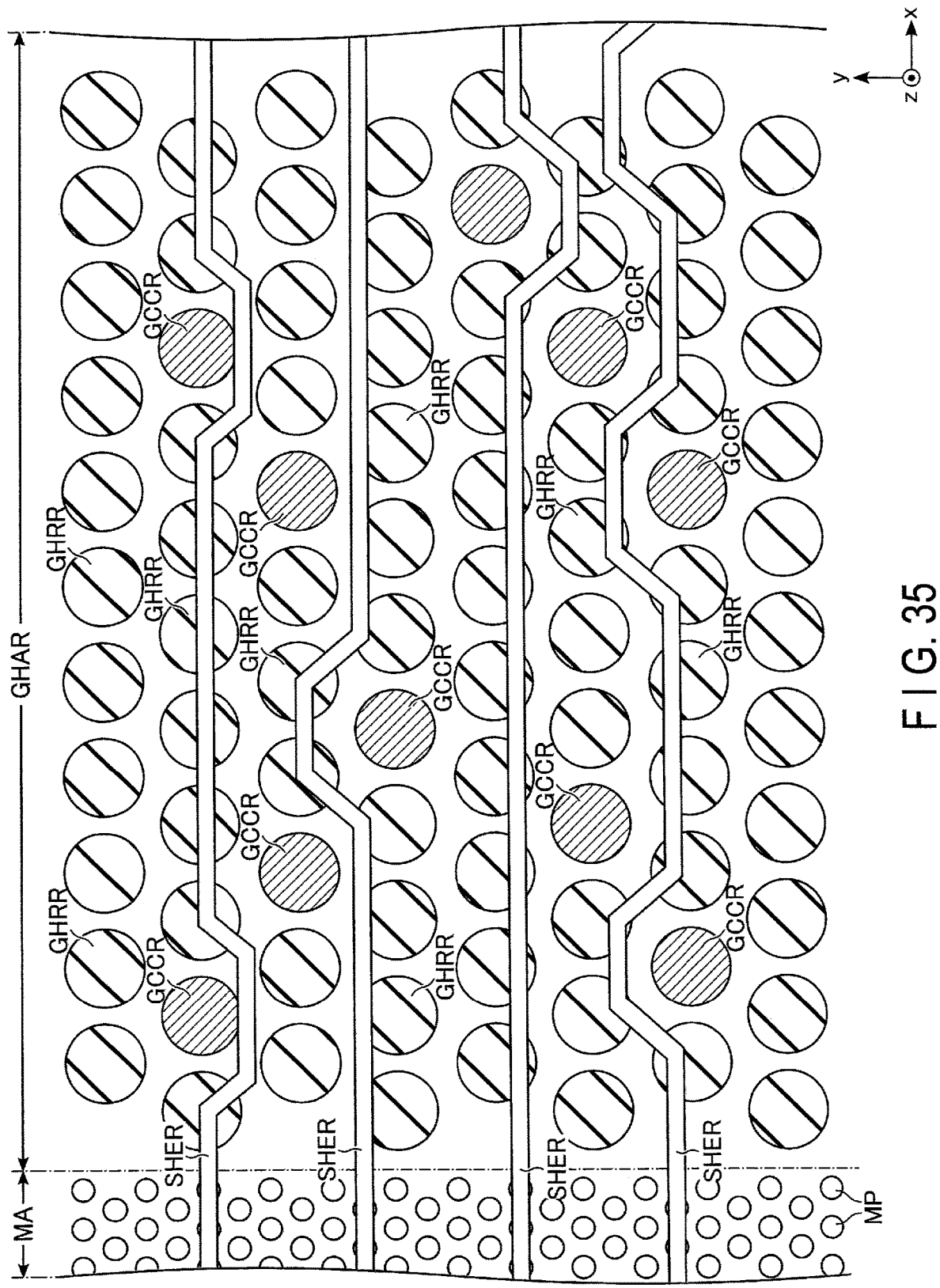
FIG. 35 shows an example of a plane structure of part of a memory cell array for reference.

To avoid this, it is possible to form the contact holes and the pillar holes in the same step. In this case, the contact holes penetrate the conductors such as the conductors 22, 23, and 24. For this reason, a structure that allows a contact to be in contact only with a single conductor is required. FIG. 35 shows a memory device having such an aspect, and shows a plane layout of part of the structure of the memory cell array of a reference memory device.

FIG. 35 shows part of the SGDL hookup area GHAR similarly to FIG. 7, and the same contraction scale as FIG. 7 is used. As shown in FIG. 35, the contacts GCCR and the support pillars GHRR are provided. The contacts GCCR have a penetration-type structure similarly to the contacts WCC of the WL hookup area WHA in the first embodiment, in other words, penetrate the conductors 22, 23, and 24 and the insulator 34. Each contact GCCR penetrates all conductors 22, 23, and 24, whereas it has an insulator WCI2 interposed between the contact and the conductors 24 other than the one with which the contact itself needs to be in contact and all conductors 22. Each contact GCCR does not have an insulator WCI2 interposed between the contact GCCR and a single conductor 24 with which the contact itself needs to be in contact.

Since the contact holes and the pillar holes are formed in the same manufacturing step and so as to have a large diameter, the contacts GCCR and the support pillars GHRR have the same diameter as the contacts WCC and the support pillars WHR of the WL hookup area WHA of the first embodiment. The SGDL hookup area GHAR shows an area necessary to provide the same number of the contacts GCC as the number of those provided in the SGDL hookup area GHA in the first embodiment, and although not shown, the WL hookup area WHA is provided in a positive x direction of the SGDL hookup area GHAR, similarly to the first embodiment.

However, as is apparent from the comparison between FIG. 35 and FIG. 7, the contacts GCCR and the support pillars GHRR of the reference SGDL hookup area GHAR have a large diameter, and therefore, the SGDL hookup area GHAR requires a larger dimension than the dimension along the x-axis shown in FIG. 7. This prevents reduction in size of a reference memory device.

Similarly to the members SHE of the first embodiment, the members SHER extend along the x-axis on the xy-plane, detouring the contacts GCCR. Based on the fact that the diameter of the contacts GCCR is large, it is necessary for the members SHER to be greatly bended to change the y-axis coordinate, so as to detour the contacts GCCR. The formation of such a member SHE is extremely difficult because the size of the memory device in the first embodiment or for the reference memory device is extremely small.

According to the first embodiment, the contacts WCC and the support pillars WHR in the WL hookup area WHA have a larger diameter than the diameter of the memory pillars MP. For this reason, it is possible to suppress deformation of the structure of the memory cell array 10, particularly the structure when the insulators SM are removed as shown in FIG. 28. The contacts WCC and the support pillars WHR cannot be formed in the same manufacturing step as that in which the memory pillars MP are formed; however, it is possible to form the contact holes WCH and the pillar holes WHH in the same manufacturing step through the use of the contacts WCC of a penetration-type structure. It is therefore possible to effectively form the contacts WCC and the support pillars WHR having a larger diameter than that of the memory pillars MP.

The contacts GCC of the SGDL hookup area GHA on the other hand have a non-penetration-type structure; in other words, these contacts GCC are in contact with the upper surface of a single conductor 24 with which the contacts need to be in contact among the conductors 22, 23, and 24, without penetrating all conductors 22, 23, and 24. Since the contacts GCC have a non-penetration-type structure, the contact holes GCH for the contacts GCC are formed not necessarily in the same manufacturing step as that in which the contact holes WCH and the pillar holes WHH of the WL hookup area WHA are formed. For this reason, the contacts GCC can have a smaller diameter than the diameter of the contacts WCC and the support pillars WHR in the WL hookup area WHA.

Furthermore, the support pillars GHR of the SGDL hookup areas GHA are not formed in the same manufacturing step as that in which the contact holes WCH and the pillar holes WHH of the WL hookup area WHA are formed. For this reason, the support pillars GHR can have a smaller diameter than the diameter of the contacts WCC and the support pillars WHR of the WL hookup area WHA.

Since the contacts GCC and the support pillars GHR of the SGDL hookup area GHA have a smaller diameter than the diameter of the contacts WCC and the support pillars WHR of the WL hookup area WHA, as is apparent from the comparison between FIG. 7 and FIG. 35, the dimension of the SGDL hookup area GHA of the first embodiment along the x-axis is smaller than the dimension of the reference SGDL hookup area GHAR along the x-axis. In other words, it is possible to provide a memory device having a small area size.

The support pillars GHR of the SGDL hookup area GHA have a diameter differing from that of the support pillars WHR and the contacts WCC of the WL hookup area WHA. For this reason, the pillar holes GHH for the support pillars GHR of the SGDL hookup area GHA cannot be formed in the same manufacturing step as that in which the pillar holes WHH for the support pillars WHR and the contact holes WCH for the contacts WCC of the WL hookup area WHA are formed. However, in the first embodiment, the pillar holes GHH for the support pillars GHR are formed in the same manufacturing step as that in which the memory holes MH are formed. For this reason, the difference in the number of manufacturing steps between the first embodiment case and the case where the holes for the contact GCCR, the support pillars GHRR, the contacts WCC, and the support pillars WH are formed in the same manufacturing step, which is possible with the structure shown in FIG. 35, is suppressed. In the WL hookup area WHA having a larger area size as the number of the conductors 23 increases, a number of support pillars GHR having a large diameter are provided. For this reason, even when the diameter of the support pillars GHR in the SGDL hookup area GHA is smaller than the diameter of the support pillar GHRR in the reference memory device, the structure of the memory cell array 10 can be sufficiently maintained by the support pillars WHR.

Thus, according to the first embodiment, it is possible to provide a memory device having a small area size that allows the structure of the memory cell array to be maintained and that can be manufactured in fewer steps.

1.4. Modification

With reference to FIG. 4, the example wherein the members SHE overlap the 5th, 10th, 15th, and 20th memory pillars MP from the uppermost in FIG. 4 is described in the above. Each member SHE does not necessarily overlap the memory pillars MP aligned along the x-axis, in other words, a single row of memory pillars MP. For example, as shown in FIG. 36, one or more members SHE may overlap two rows of memory pillars MP aligned along the y-axis. FIG. 36 shows an example of a plane structure of part of a memory cell area of a memory device according to a modification of the first embodiment, along the xy-plane. As shown in FIG. 36, the members SHE overlap the 4th and 5th rows, the 8th and 9th rows, the 12th and 13th rows, and the 16th and 17th rows of memory pillars counted from the top of FIG. 36, respectively.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a plurality of first conductors arranged in a first direction at intervals, each first conductor having a first portion not covered by an adjacent first conductor on a side of the first direction of the first conductor;
   a memory pillar extending in the first direction and being in contact with the first conductors, the memory pillar including a semiconductor and a film that surrounds the semiconductor;
   a third conductor extending in the first direction and having a lower surface in contact with a surface of the first portion of a second conductor on a side of the first direction, the second conductor being one of the first conductors;
   a fourth conductor extending in the first direction, the fourth conductor penetrating the first portion of a fifth conductor which is one of the first conductors and at least one sixth conductor located closer to a side of a second direction opposite to the first direction than the fifth conductor, a side surface of the fourth conductor being in contact with the fifth conductor; and
   at least one first insulator that covers a surface of each of the at least one sixth conductor, the surface facing the fourth conductor, wherein
   no conductor that extends in the first direction, penetrates the first conductors, and is in contact with the third conductor is provided farther in the second direction than the third conductor; and first comprising:
   a second insulator extending in the first direction and passing through at least one of the first conductors; and
   a third insulator extending in the first direction and passing through at least one of the first conductors:
   wherein
   the second insulator has a lower surface included in a same layer as a layer that includes a lower surface of the memory pillar, and
   the third insulator has a lower surface included in a same layer as a layer that includes a lower surface of the fourth conductor.

2. The device of claim 1, wherein
the lower surface of the second insulator is located away from a seventh conductor by a first distance, the seventh conductor being a furthest one of the first conductors,
the lower surface of the third insulator is located away from the seventh conductor by a second distance, and
the first distance and the second distance are different.

3. A memory device of comprising:
a plurality of first conductors arranged in a first direction at intervals, each first conductor having a first portion not covered by an adjacent first conductor on a side of the first direction of the first conductor;
a memory pillar extending in the first direction and being in contact with the first conductors, the memory pillar including a semiconductor and a film that surrounds the semiconductor;
a third conductor extending in the first direction and having a lower surface in contact with a surface of the first portion of a second conductor on a side of the first direction, the second conductor being one of the first conductors;
a fourth conductor extending in the first direction, the fourth conductor penetrating the first portion of a fifth conductor which is one of the first conductors and at least one sixth conductor located closer to a side of a second direction opposite to the first direction than the fifth conductor, a side surface of the fourth conductor being in contact with the fifth conductor; and
at least one first insulator that covers a surface of each of the at least one sixth conductor, the surface facing the fourth conductor, wherein
no conductor that extends in the first direction, penetrates the first conductors, and is in contact with the third conductor is provided farther in the second direction than the third conductor; and first comprising:
a second insulator extending in the first direction and passing through at least one of the first conductors; and
a third insulator extending in the first direction and passing through at least one of the first conductors:
wherein
each of the fourth conductor and the third conductor has a diameter larger than a diameter of the second insulator, and
each of the third conductor and the second insulator has a diameter larger than a diameter of the memory pillar.

4. The device of claim 3, wherein
each of the fourth conductor and the third conductor has a diameter larger than a diameter of the third insulator.

5. A memory device of comprising:
a plurality of first conductors arranged in a first direction at intervals, each first conductor having a first portion not covered by an adjacent first conductor on a side of the first direction of the first conductor;
a memory pillar extending in the first direction and being in contact with the first conductors, the memory pillar including a semiconductor and a film that surrounds the semiconductor;
a third conductor extending in the first direction and having a lower surface in contact with a surface of the first portion of a second conductor on a side of the first direction, the second conductor being one of the first conductors;
a fourth conductor extending in the first direction, the fourth conductor penetrating the first portion of a fifth conductor which is one of the first conductors and at least one sixth conductor located closer to a side of a second direction opposite to the first direction than the fifth conductor, a side surface of the fourth conductor being in contact with the fifth conductor; and
at least one first insulator that covers a surface of each of the at least one sixth conductor, the surface facing the fourth conductor, wherein
no conductor that extends in the first direction, penetrates the first conductors, and is in contact with the third conductor is provided farther in the second direction than the third conductor; and first comprising:
a second insulator extending in the first direction and passing through at least one of the first conductors; and
a third insulator extending in the first direction and passing through at least one of the first conductors:
wherein
the memory pillar is located within a first area,
the second insulator and the third conductor are located within a second area,
the third insulator and the fourth conductor are located within a third area,
the second area is located closer to a side of a third direction intersecting the first direction than the first area, and
the third area is located closer to the third-direction side than the second area.

* * * * *